US008084281B2

(12) United States Patent
Shibata et al.

(10) Patent No.: US 8,084,281 B2
(45) Date of Patent: Dec. 27, 2011

(54) SEMICONDUCTOR SUBSTRATE, ELECTRONIC DEVICE, OPTICAL DEVICE, AND PRODUCTION METHODS THEREFOR

(75) Inventors: Naoki Shibata, Aichi (JP); Koji Hirata, Aichi (JP); Shiro Yamazaki, Aichi (JP); Katsuhiro Imai, Nagoya (JP); Makoto Iwai, Nagoya (JP); Takatomo Sasaki, Suita (JP); Yusuke Mori, Suita (JP); Fumio Kawamura, Suita (JP)

(73) Assignees: Toyoda Gosei Co., Ltd., Nishikasugai-Gun, Aichi-Ken (JP); NGK Insulators, Ltd., Nagoya-Shi, Aichi (JP); Osaka University, Suita-Shi, Osaka (JP)

( * ) Notice: Subject to any disclaimer, the term of this patent is extended or adjusted under 35 U.S.C. 154(b) by 486 days.

(21) Appl. No.: 12/087,048

(22) PCT Filed: Mar. 15, 2007

(86) PCT No.: PCT/JP2007/055942
§ 371 (c)(1),
(2), (4) Date: Oct. 16, 2008

(87) PCT Pub. No.: WO2007/105832
PCT Pub. Date: Sep. 20, 2007

(65) Prior Publication Data
US 2010/0301358 A1    Dec. 2, 2010

(30) Foreign Application Priority Data

Mar. 16, 2006  (JP) .................................. 2006-072748
Apr. 26, 2006  (JP) .................................. 2006-122400

(51) Int. Cl.
*H01L 21/00* (2006.01)
(52) U.S. Cl. ................ 438/22; 438/46; 438/47; 257/98; 257/192; 257/615; 257/E29.089; 257/E31.019; 257/E33.023

(58) Field of Classification Search .................... 438/22, 438/46, 47; 257/98, 192, 615, E29.089, E31.019, 257/E33.023
See application file for complete search history.

(56) References Cited

U.S. PATENT DOCUMENTS
6,270,569 B1   8/2001  Shibata et al.
(Continued)

FOREIGN PATENT DOCUMENTS
CN          1219614 A       6/1999
(Continued)

OTHER PUBLICATIONS

Chinese Office Action dated Feb. 10, 2011, with English translation.
(Continued)

*Primary Examiner* — Andy Huynh
(74) *Attorney, Agent, or Firm* — McGinn IP Law Group, PLLC

(57) ABSTRACT

The present invention provides a method for producing a semiconductor substrate, the method including reacting nitrogen (N) with gallium (Ga), aluminum (Al), or indium (In), which are group III elements, in a flux mixture containing a plurality of metal elements selected from among alkali metals and alkaline earth metals, to thereby grow a group III nitride based compound semiconductor crystal. The group III nitride based compound semiconductor crystal is grown while the flux mixture and the group III element are mixed under stirring. At least a portion of a base substrate on which the group III nitride based compound semiconductor crystal is grown is formed of a flux-soluble material, and the flux-soluble material is dissolved in the flux mixture, at a temperature near the growth temperature of the group III nitride based compound semiconductor crystal, during the course of growth of the semiconductor crystal.

20 Claims, 15 Drawing Sheets

U.S. PATENT DOCUMENTS

| | | |
|---|---|---|
| 7,459,023 B2 | 12/2008 | Yamazaki et al. |
| 2005/0048686 A1 | 3/2005 | Kitaoka et al. |
| 2006/0051942 A1* | 3/2006 | Sasaki et al. ............... 438/483 |
| 2006/0169197 A1* | 8/2006 | Sasaki et al. ............... 117/2 |
| 2007/0101931 A1* | 5/2007 | Yamazaki et al. ........... 117/105 |
| 2008/0008642 A1* | 1/2008 | Mori et al. ............... 423/412 |
| 2009/0155580 A1* | 6/2009 | Shibata et al. ............ 428/336 |

FOREIGN PATENT DOCUMENTS

| | | |
|---|---|---|
| JP | 11-60394 | 3/1999 |
| JP | 11-261109 | 9/1999 |
| JP | 2000-174336 | 6/2000 |
| JP | 2000-286509 | 10/2000 |
| JP | 2000-327495 | 11/2000 |
| JP | 2001-58900 | 3/2001 |
| JP | 2001-64097 | 3/2001 |
| JP | 2003-163170 | 6/2003 |
| JP | 2004-292286 | 10/2004 |
| JP | 2004-300024 | 10/2004 |
| JP | 2005-285869 | 10/2005 |
| WO | WO 2004/083498 | 9/2004 |

OTHER PUBLICATIONS

Taiwanese Notification of Examination dated Jan. 10, 2011, with English translation.

PCT/IB/326.

PCT/IB/373.

PCT/ISA/237.

* cited by examiner

Fig. 2-A
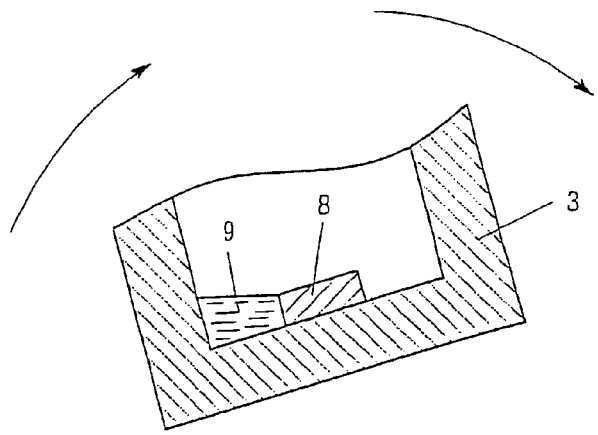
Fig. 2-B
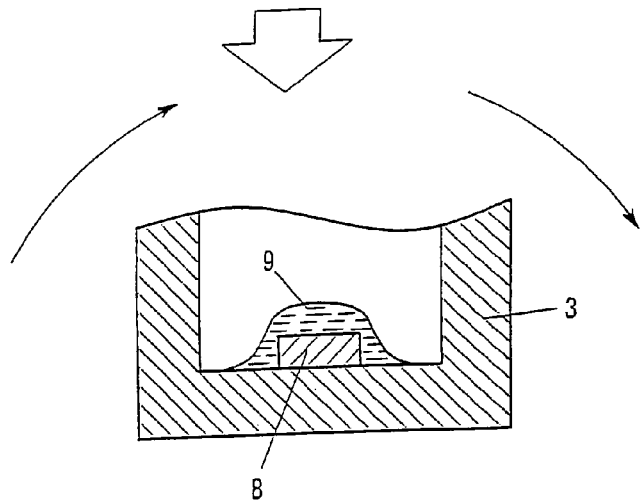
Fig. 2-C
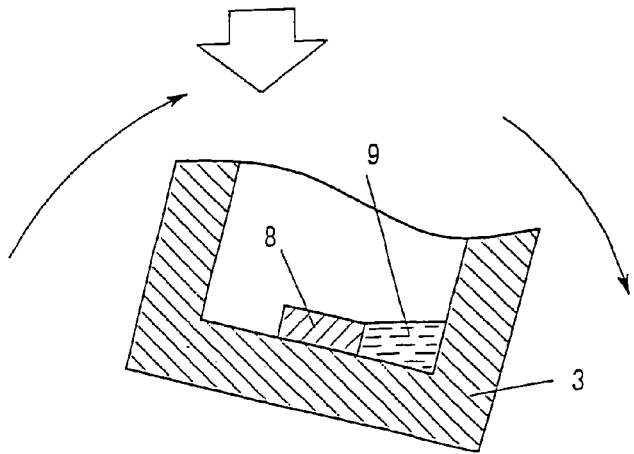

Fig. 4-A
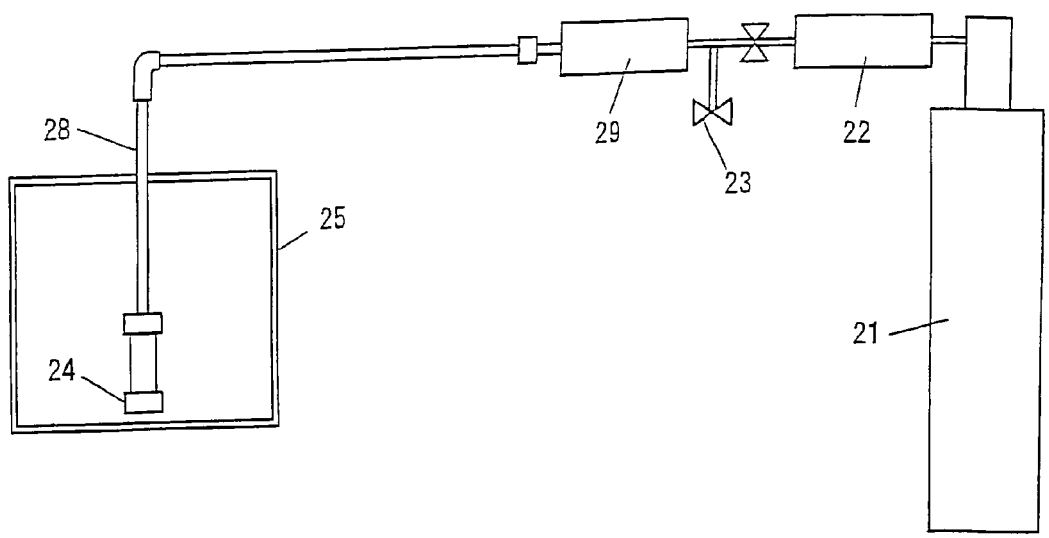

Fig. 4-B
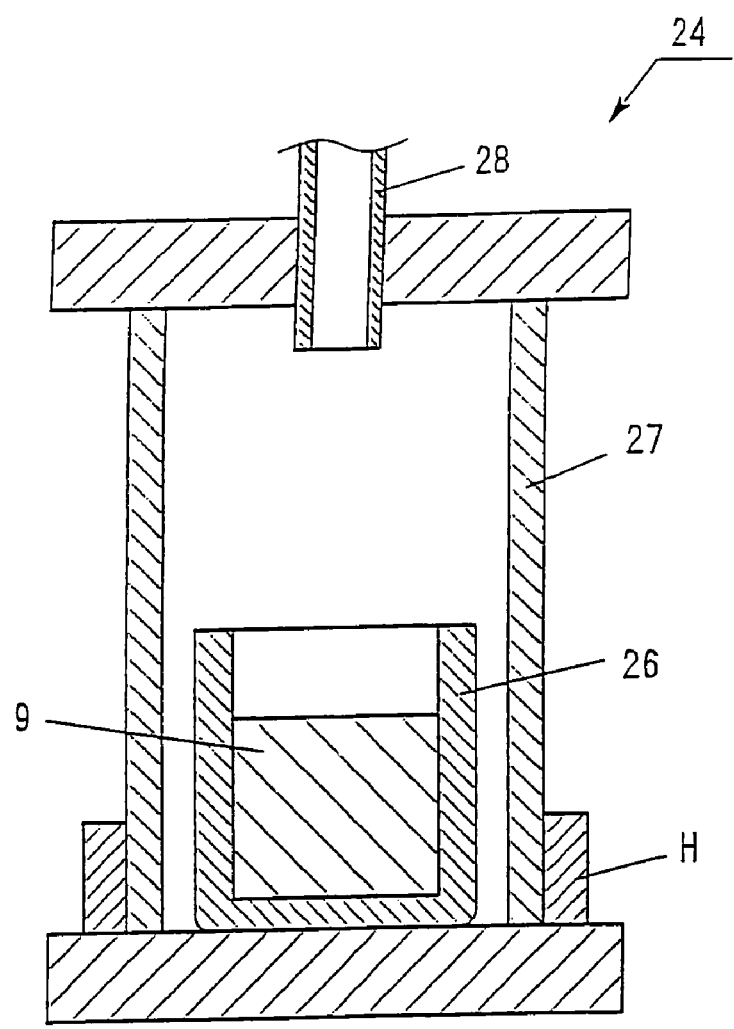

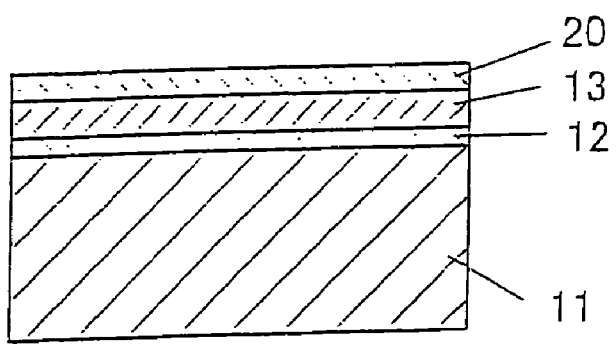
Fig.5-A
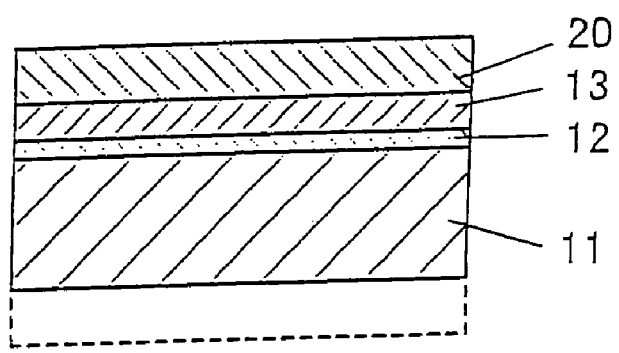
Fig.5-B
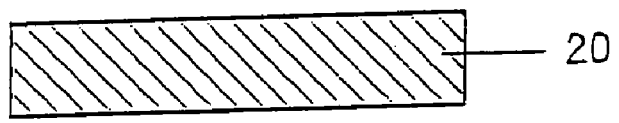
Fig.5-C

FIG. 7

| | | | Transistor 900 | Transistor 100 |
|---|---|---|---|---|
| Crystal growth conditions | Layer A | Al compositional proportion x | 0.00 | 0.00 |
| | | Thickness $d_A$ | 2 [μm] | 2 [μm] |
| | | Growth temperature $T_A$ | 1050 [°C] | 1100 [°C] |
| | | Pressure $P_A$ | 1013 [hPa] | 1013 [hPa] |
| | Layer B | Al compositional proportion y | 0.25 | 0.25 |
| | | Thickness $d_B$ | 35 [nm] | 35 [nm] |
| | | Growth temperature $T_B$ | 1150 [°C] | 1000 [°C] |
| | | Pressure $P_B$ | 900 [hPa] | 1013 [hPa] |
| Properties | | On-current I | 0.7 [A/mm] | 1.1 [A/mm] |
| | | Sheet resistance ρ | 650 [Ω/square] | 400 [Ω/square] |
| | | Mobility μ | 1000 [cm²/V·sec] | 1600 [cm²/V·sec] |

Fig. 10-A
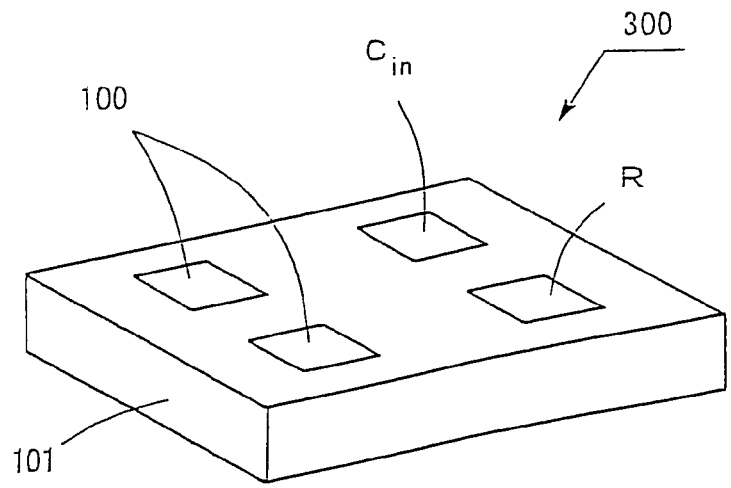
Fig. 10-B
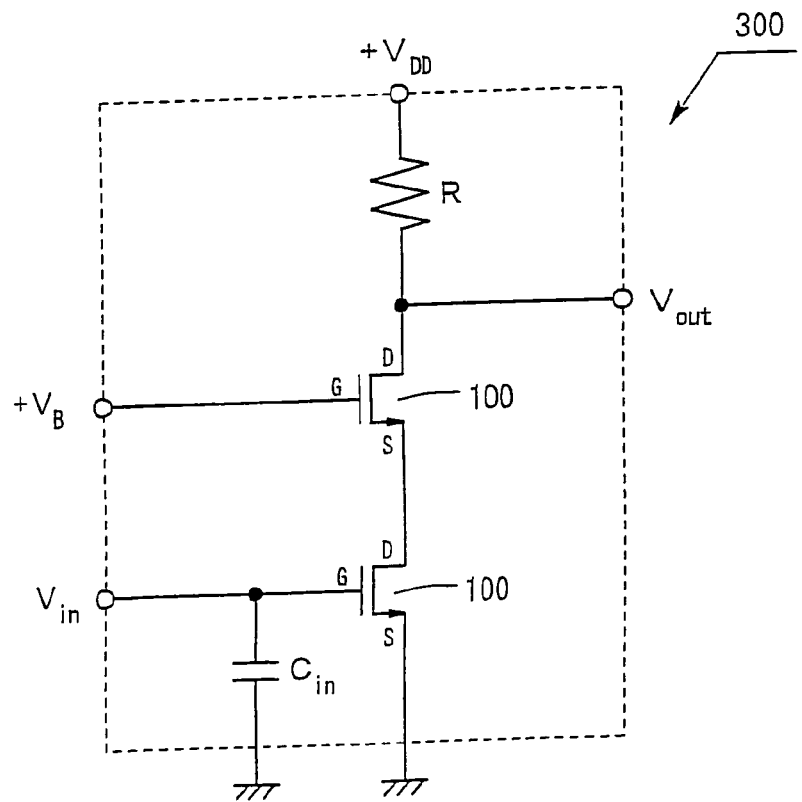

SEMICONDUCTOR SUBSTRATE, ELECTRONIC DEVICE, OPTICAL DEVICE, AND PRODUCTION METHODS THEREFOR

TECHNICAL FIELD

The present invention relates to a method for producing a semiconductor substrate, the method including growing a group III nitride based compound semiconductor crystal through the flux process employing a flux; to a semiconductor substrate for electronic devices which is produced through the production method; to an electronic device; to a transistor; to an optical device substrate; to a semiconductor light-emitting device; and to a semiconductor photoreceptor.

As used herein, the term "electronic device" encompasses semiconductor devices including a semiconductor crystal layer (e.g., an amplifier, a switching device, and a rectifying device), which are formed of a transistor, a diode, etc. The term "electronic device" also encompasses semiconductor integrated circuits having such a semiconductor crystal layer and at least one of a resistor, a capacitor, and an inductor.

The aforementioned transistor may be a field-effect transistor or a bipolar transistor. Examples of field-effect transistors which can be produced according to the present invention include semiconductor devices such as MISFET, MOSFET, HFET, MODFET, JFET, HJFET, and HEMT; and power transistors for power control, such as power MOSFET and IGBT.

The aforementioned group III nitride based compound semiconductor encompasses two-component, three-component, and four-component InAlGaN semiconductor crystals having arbitrary compositional proportions; and such semiconductors containing a p-type or n-type impurity.

BACKGROUND ART

Conventionally employed sodium (Na) flux processes, which grow gallium nitride crystal in an Na flux, can grow a GaN single crystal at a pressure of about 5 MPa and at a relatively low temperature of 600° C. to 800° C.

As disclosed in, for example, the below-described Patent Documents 1 to 5, in conventional methods for producing a group III nitride based compound semiconductor crystal, the crystal is grown through the flux process. Such a conventional production method generally employs, as a base substrate (seed crystal), a template formed by successively providing, on a sapphire substrate, a buffer layer and a semiconductor layer (e.g., a single-crystal GaN layer); a GaN single-crystal self-standing substrate; or a similar substrate.

[Patent Document 1] Japanese Patent Application Laid-Open (kokai) No. H11-060394
[Patent Document 2] Japanese Patent Application Laid-Open (kokai) No. 2001-058900
[Patent Document 3] Japanese Patent Application Laid-Open (kokai) No. 2001-064097
[Patent Document 4] Japanese Patent Application Laid-Open (kokai) No. 2004-292286
[Patent Document 5] Japanese Patent Application Laid-Open (kokai) No. 2004-300024

DISCLOSURE OF THE INVENTION

Problems to be Solved by the Invention

Particularly when, for example, a field-effect transistor is produced from a semiconductor device substrate, crystal quality of the substrate is a very important factor for facilitating control of formation or removal of a two-dimensional electron gas in the vicinity of an interface between semiconductor crystal layers, reducing sheet resistance of the layers, reducing driving voltage or leakage current of the device, or improving electrostatic breakdown voltage, service life, yield, etc. of the device.

Meanwhile, when a substrate for a semiconductor optical device (e.g., an LED, an LD, or an optical sensor) is produced from a group III nitride based compound semiconductor crystal, crystal quality of the device substrate is a very important factor for improving internal or external quantum efficiency of the semiconductor device, reducing driving voltage of the semiconductor device, or improving electrostatic breakdown voltage, service life, yield, etc. of the semiconductor device.

However, conventional Na flux processes encounter difficulty in producing a semiconductor crystal of high quality having low dislocation density and an almost flat crystal growth surface. Particularly, difficulty is encountered in producing a transparent semiconductor crystal of low dislocation density which can be applied to optical devices. In addition, the conventional Na flux processes pose problems in terms of crystal growth rate and yield, and therefore difficulty is encountered in applying the flux processes to production of a semiconductor substrate (e.g., a semiconductor substrate for electronic devices, or an optical device semiconductor substrate). Such problems also arise in the case of growth of a group III nitride based compound semiconductor crystal formed of $In_xAl_yGa_{1-x-y}N$ ($0 \leq x \leq 1$, $0 \leq y \leq 1$, $0 \leq x+y \leq 1$).

In the case where the aforementioned template is employed as a base substrate, when a target group III nitride based compound semiconductor crystal is grown on the base substrate so as to have a large thickness, a large number of cracks are generated in the semiconductor crystal during removal of the semiconductor crystal from a reaction chamber, because of a great difference in thermal expansion coefficient between the semiconductor crystal and the sapphire substrate. Therefore, in this case, difficulty is encountered in producing, for example, a semiconductor crystal of high quality having a thickness of 300 μm or more.

The present invention has been accomplished in order to solve the aforementioned problems. An object of the present invention is to produce, through the flux process at low cost, a semiconductor substrate of high quality for fabricating electronic devices or optical devices.

Another object of the present invention is to facilitate improvement of operational characteristics of any of the aforementioned electronic devices fabricated from such a semiconductor substrate.

Yet another object of the present invention is to produce, from such a semiconductor substrate, a semiconductor optical device exhibiting high operational efficiency and electrostatic breakdown voltage.

Means for Solving the Problems

The aforementioned problems are effectively solved by techniques falling under the below-described aspects.

In a first aspect of the present invention, there is provided a method for producing a semiconductor substrate for an electronic device or an optical device, the method comprising reacting nitrogen (N) with gallium (Ga), aluminum (Al), or indium (In), which are group III elements, in a flux mixture containing a plurality of metal elements selected from among alkali metals and alkaline earth metals, to thereby grow a group III nitride based compound semiconductor crystal, wherein the group III nitride based compound semiconductor crystal is grown while the flux mixture and the group III element are mixed under stirring.

In the present invention, mixing treatment may be performed through physical movement (e.g., swinging, rocking, or rotation) of a reaction container, or may be performed by stirring the flux mixture with, for example, a stirring bar or a stirring blade. Alternatively, mixing treatment may be performed through thermal convection of the flux mixture by means of a heat gradient generated in the flux mixture by, for example, heating means. That is, in the present invention, mixing treatment may be performed through any of the aforementioned processes. These processes may be performed in any appropriate combination.

In a second aspect of the present invention, there is provided a method for producing a semiconductor substrate for an electronic device or an optical device, the method comprising reacting nitrogen (N) with gallium (Ga), aluminum (Al), or indium (In), which are group III elements, in a flux mixture containing a plurality of metal elements selected from among alkali metals and alkaline earth metals, to thereby grow a group III nitride based compound semiconductor crystal, wherein at least a portion of a base substrate on which the group III nitride based compound semiconductor crystal is grown is formed of a material which can be dissolved in the flux mixture (hereinafter the material may be referred to as a "flux-soluble material"); and the flux-soluble material is dissolved in the flux mixture, at a temperature near the growth temperature of the group III nitride based compound semiconductor crystal, during the course of growth of the semiconductor crystal or after completion of growth of the semiconductor crystal.

Examples of the flux-soluble material which may be employed include, but are not necessarily limited to, silicon (Si).

A protective film may be formed on an exposed surface of the aforementioned flux-soluble material so that the thickness or formation pattern of the protective film arbitrarily controls the time when the flux-soluble material is dissolved in the flux mixture or the dissolution rate of the flux-soluble material. Examples of the material for forming such a protective film include aluminum nitride (AlN) and tantalum (Ta). Such a protective film may be formed through any well-known technique, such as crystal growth, vacuum deposition, or sputtering.

In a third aspect of the present invention, which is drawn to a specific embodiment of the second aspect, at least a portion of the aforementioned flux-soluble material contains an impurity to be added to the group III nitride based compound semiconductor crystal.

The entirety of the flux-soluble material may be formed solely of such a necessary impurity.

In a fourth aspect of the present invention, which is drawn to a specific embodiment of the second or third aspect, the group III nitride based compound semiconductor crystal is grown while the aforementioned flux mixture and the group III element are mixed under stirring.

In this case, mixing treatment may be performed through any of the aforementioned processes.

In a fifth aspect of the present invention, which is drawn to a specific embodiment of any one of the first to fourth aspects, the aforementioned flux mixture contains sodium (Na), and lithium (Li) or calcium (Ca).

That is, the flux mixture, which contains Na as the primary component, contains either lithium (Li) or calcium (Ca) as the secondary component.

In a sixth aspect of the present invention, which is drawn to a specific embodiment of any one of the first to fifth aspects, before growth of the group III nitride based compound semiconductor crystal, the crystal growth surface of the base substrate or seed crystal is subjected to cleaning treatment at a temperature of 900° C. to 1,100° C. for one minute or more by using, as a cleaning gas, hydrogen ($H_2$) gas, nitrogen ($N_2$) gas, ammonia ($NH_3$) gas, a rare gas (He, Ne, Ar, Kr, Xe, or Rn), or a gas mixture obtained by mixing, in arbitrary proportions, two or more gases selected from among these gases.

Preferably, this cleaning treatment is performed for two minutes to 10 minutes.

In a seventh aspect of the present invention, which is drawn to a specific embodiment of any one of the first to sixth aspects, the aforementioned flux mixture contains, as an impurity to be added to the group III nitride based compound semiconductor crystal, boron (B), thallium (Tl), calcium (Ca), a Ca-containing compound, silicon (Si), sulfur (S), selenium (Se), tellurium (Te), carbon (C), oxygen (O), aluminum (Al), indium (In), alumina ($Al_2O_3$), indium nitride (InN), silicon nitride ($Si_3N_4$), silicon oxide ($SiO_2$), indium oxide ($In_2O_3$), zinc (Zn), iron (Fe), magnesium (Mg), zinc oxide (ZnO), magnesium oxide (MgO), or germanium (Ge).

The flux mixture may contain only one of these impurities, or a plurality thereof. One or a combination of these impurities may be chosen arbitrarily.

In an eighth aspect of the present invention, there is provided a semiconductor substrate for an electronic device or an optical device (hereinafter the substrate may be referred to as an "electronic-device-forming semiconductor substrate"), the substrate being produced through a semiconductor substrate production method as recited in any one of the first to seventh aspects of the present invention, which substrate has a surface dislocation density of $1 \times 10^5$ $cm^{-2}$ or less, and a maximum size of 1 cm or more.

The lower the dislocation density, the more preferred the substrate, and the greater the maximum size, the more preferred the substrate. From the viewpoint of industrial utility, the semiconductor substrate particularly preferably assumes, for example, a circular shape having a diameter of about 50 mm to about 150 mm, a square shape having a size of about 27 mm×about 27 mm, or a square shape having a size of about 12 mm×about 12 mm.

In a ninth aspect of the present invention, which is drawn to a specific embodiment of the eighth aspect, the aforementioned semiconductor substrate has a thickness of 300 μm or more.

The thickness of the semiconductor substrate is preferably 400 μm or more, more preferably about 400 μm to about 600 μm.

In a tenth aspect of the present invention, there is provided an electronic device comprising a crystal growth substrate, and a group III nitride based compound semiconductor crystal layer provided thereon, wherein the crystal growth substrate is formed of an electronic-device-forming semiconductor substrate as recited in the eighth or ninth aspect of the present invention.

As used herein, the term "electronic device" encompasses semiconductor devices including a semiconductor crystal layer (e.g., an amplifier, a switching device, and a rectifying device), which are formed of a transistor, a diode, etc. The term "electronic device" also encompasses semiconductor integrated circuits having such a semiconductor crystal layer and at least one of a resistor, a capacitor, and an inductor. The aforementioned transistor may be a field-effect transistor or a bipolar transistor.

In an eleventh aspect of the present invention, there is provided a field-effect transistor comprising a group III nitride based compound semiconductor crystal layer formed through crystal growth, the transistor comprising an electronic-device-forming semiconductor substrate as recited in the eighth or ninth aspect of the present invention; a channel layer A formed through direct or indirect crystal growth on the electronic-device-forming semiconductor substrate; and a carrier-supply layer B formed through direct crystal growth on the channel layer A, wherein the band gap of the carrier-supply layer B ($E_B$) is greater than the band gap of the channel layer A ($E_A$) at least in the vicinity of the interface between the channel layer A and the carrier-supply layer B.

Examples of the aforementioned field-effect transistor include high-frequency semiconductor devices such as MIS-FET, MOSFET, HFET, MODFET, JFET, HJFET, and HEMT; and power transistors for power control, such as power MOSFET and IGBT.

In a twelfth aspect of the present invention, which is drawn to a specific embodiment of the eleventh aspect, at least one of the aforementioned channel layer A and carrier-supply layer B is formed of an undoped semiconductor crystal.

In a thirteenth aspect of the present invention, which is drawn to a specific embodiment of the eleventh or twelfth aspect, the aforementioned channel layer A is formed of two-component or three-component $Al_xGa_{1-x}N$ ($0 \leq x < 1$), and the aforementioned carrier-supply layer B is formed of three-component $Al_yGa_{1-y}N$ ($x < y \leq 1$).

In a fourteenth aspect of the present invention, which is drawn to a specific embodiment of any one of the eleventh to thirteenth aspects, the aforementioned interface is formed to have a virtually flat plane by suppressing sublimation of atoms from a portion of the channel layer A which are present in the vicinity of the aforementioned interface.

In this case, the aforementioned channel layer A is more preferably formed of a GaN crystal, and the aforementioned carrier-supply layer B is more preferably formed of $Al_yGa_{1-y}N$ ($0.15 \leq y \leq 0.30$).

In a fifteenth aspect of the present invention, which is drawn to a specific embodiment of any one of the eleventh to fourteenth aspects, the aforementioned carrier-supply layer B is formed of $Al_yGa_{1-y}N$ ($0.45 > y > 0.04$), and the aluminum compositional proportion y in the carrier-supply layer B is generally reduced monotonously as the distance from the aforementioned interface increases.

In this case, the aluminum compositional proportion y in the carrier-supply layer B as determined at the aforementioned interface is more preferably 0.15 to 0.40, and the aluminum compositional proportion y in the carrier-supply layer B as determined at the surface opposite the interface is more preferably 0.05 to 0.20.

In a sixteenth aspect of the present invention, there is provided a semiconductor light-emitting device comprising a crystal growth substrate, and a plurality of group III nitride based compound semiconductor crystal layers provided thereon, wherein the crystal growth substrate is formed of a semiconductor substrate as recited in the eighth or ninth aspect of the present invention.

Examples of such a semiconductor light-emitting device include an LED (light-emitting diode) and an LD (semiconductor laser).

In a seventeenth aspect of the present invention, there is provided a semiconductor photoreceptor comprising a crystal growth substrate, and a plurality of group III nitride based compound semiconductor crystal layers provided thereon, wherein the crystal growth substrate is formed of a semiconductor substrate as recited in the eighth or ninth aspect of the present invention.

Examples of such a semiconductor photoreceptor include a photoreceptor constituting an imaging apparatus, and an optical sensor.

In an eighteenth aspect of the present invention, which is drawn to a specific embodiment of the sixteenth aspect, the aforementioned light-emitting device comprises a light-emitting layer formed of a group III nitride based compound semiconductor, and a group III nitride based compound semiconductor crystal layer provided on the light-emitting layer, the semiconductor crystal layer containing aluminum and an acceptor impurity, and being formed through crystal growth treatment by use of a carrier gas containing a gas mixture of hydrogen ($H_2$) and nitrogen ($N_2$) in which the relative nitrogen partial pressure is 40% to 80%.

In a nineteenth aspect of the present invention, there is provided a method for producing a semiconductor light-emitting device, the method comprising providing, on a crystal growth substrate, a plurality of group III nitride based compound semiconductor crystal layers, wherein the crystal growth substrate is formed of a transparent group III nitride based compound semiconductor crystal in bulk form, and a semiconductor crystal layer containing aluminum and an acceptor impurity is provided on a light-emitting layer through crystal growth treatment by use of a carrier gas containing a gas mixture of hydrogen ($H_2$) and nitrogen ($N_2$) in which the relative nitrogen partial pressure is 40% to 80%.

In the eighteenth and nineteenth aspects of the present invention, the relative nitrogen partial pressure is more preferably 50 to 75%, much more preferably 60 to 70%. The aforementioned aluminum-and-acceptor-impurity-containing semiconductor crystal layer is not necessarily provided directly on the crystal growth substrate. An optional semiconductor layer may be provided between the semiconductor crystal layer and the crystal growth substrate through, for example, additional crystal growth treatment. No particular limitation is imposed on the crystal growth conditions (e.g., the aforementioned relative nitrogen partial pressure) for providing such an optional semiconductor layer.

In a twentieth aspect of the present invention, which is drawn to a specific embodiment of the sixteenth or seventeenth aspect, the optical device comprises at least one contact layer, an active layer, and a plurality of structures exhibiting resistance to electrostatic voltage (hereinafter such a structure may be referred to as a "voltage-resistant structure") provided therebetween, each of the structures including two layers; i.e., an undoped semiconductor layer provided on the side of the contact layer, and an impurity-doped semiconductor layer (hereinafter such an impurity-doped semiconductor layer may be referred to simply as a "doped semiconductor layer") provided on the undoped semiconductor layer.

The aforementioned optical device may be an LED, a semiconductor laser, a photoreceptor for use in an imaging device, or an optical sensor. The aforementioned contact layer may be an n-type or p-type contact layer. Both n-type and p-type contact layers may employ the aforementioned voltage-resistant structures.

The aforementioned impurity may be an n-type or p-type impurity. The doped semiconductor layer may contain a plurality of n-type (or p-type) impurities. The doped semiconductor layer may contain both n-type and p-type impurities. In the case of formation of a single doped semiconductor layer containing both n-type and p-type impurities, when, for example, an n-type contact layer is formed, an n-type impurity is employed in an amount greater than that of a p-type impurity.

The aforementioned active layer may have an MQW structure, an SQW structure, or another layered structure.

In a twenty-first aspect of the present invention, which is drawn to a specific embodiment of the twentieth aspect, the aforementioned contact layer is an n-type contact layer, and the aforementioned impurity is an n-type impurity.

In a twenty-second aspect of the present invention, which is drawn to a specific embodiment of the sixteenth aspect, the semiconductor light-emitting device comprises a DBR multiple layer which is formed by alternatingly providing, between two p-type semiconductor crystal layers, a plurality of undoped group III nitride based compound semiconductor crystal layers having different compositions in a repeated manner.

The DBR multiple layer may have a multi-layer structure including at least one pair of layers. Preferably, the DBR multiple layer has a multi-layer structure including about two to about 10 pairs of layers. When the number of layers included in the DBR multiple layer is small, the light reflectance of the DBR multiple layer may fail to be improved, or electrostatic breakdown voltage is less likely to be improved. In contrast, when the number of layers included in the DBR multiple layer is excessively large, driving voltage increases.

More preferably, one of the aforementioned two p-type semiconductor crystal layers is a p-type contact layer. This configuration can suppress increase in driving voltage of the light-emitting device due to provision of the DBR multiple layer.

In a twenty-third aspect of the present invention, which is drawn to a specific embodiment of the twenty-second aspect, the aforementioned DBR multiple layer includes a plurality of undoped GaN crystal layers, and a plurality of undoped $Al_xGa_{1-x}N$ crystal ($0<x<1$) layers.

In a twenty-fourth aspect of the present invention, there is provided a method for producing a semiconductor optical device, the method comprising providing, on a crystal growth substrate, a plurality of group III nitride based compound semiconductor crystal layers, wherein the crystal growth substrate is formed of a semiconductor substrate as recited in the eighth or ninth aspect of the present invention, and, before growth of the group III nitride based compound semiconductor crystal layers, the crystal growth surface of the semiconductor substrate is subjected to cleaning treatment at a temperature of 900° C. to 1,100° C. for one minute or more by using, as a cleaning gas, hydrogen ($H_2$) gas, nitrogen ($N_2$) gas, ammonia ($NH_3$) gas, a rare gas (He, Ne, Ar, Kr, Xe, or Rn), or a gas mixture obtained by mixing, in arbitrary proportions, two or more gases selected from among these gases.

Preferably, this cleaning treatment is performed for two minutes 10 minutes. The above-described means of the present invention can effectively or reasonably solve the aforementioned problems.

Effects of the Invention

Effects obtained by the above-described aspects of the present invention are as follows.

Specifically, according to any one of the first to seventh aspects of the present invention, a semiconductor crystal of high quality can be efficiently produced through the flux process at low cost. Therefore, a semiconductor substrate according to the eighth or ninth aspect of the present invention, which is employed for fabricating an electronic device or an optical device, can be efficiently produced on a practical production level in high quality.

Particularly according to the first aspect of the present invention, the rate of dissolution of nitrogen in a flux mixture is effectively increased through mixing under stirring, and crystal materials are uniformly distributed in the flux mixture. In addition, such a suitable flux can be always uniformly supplied to a crystal growth surface. Therefore, according to the first aspect of the present invention, there can be produced a transparent semiconductor substrate of high quality for fabricating an electronic device or an optical device, the substrate having low dislocation density and an almost flat crystal growth surface. Since high crystal growth rate and yield are achieved by the aforementioned effects, a bulk-form semiconductor substrate of high quality can be readily produced through crystal growth as desired.

According to the second aspect of the present invention, during the course of growth of a semiconductor crystal or after completion of growth of the semiconductor crystal, a flux-soluble material is dissolved in a flux mixture at a temperature near the growth temperature of the semiconductor crystal. Thus, when a target semiconductor crystal is removed from a reaction chamber, stress—which would otherwise occur due to, for example, a decrease in temperature upon removal of the semiconductor crystal from the reaction chamber—is not applied between the semiconductor crystal (i.e., semiconductor substrate for an electronic device or an optical device) and a base substrate. Therefore, according to the second aspect of the present invention, the crack density of the target electronic-device-forming semiconductor substrate can be considerably reduced as compared with conventional semiconductor substrates.

The aforementioned flux-soluble material employed may be a relatively inexpensive material such as silicon (Si). Therefore, production cost can be reduced as compared with a conventional technique employing a GaN single-crystal self-standing substrate as a base substrate.

According to the third aspect of the present invention, when dissolution of the aforementioned flux-soluble material in the flux mixture is employed as a technique for addition of an impurity, addition of an impurity to a target semiconductor substrate does not require any other technique. Furthermore, the amount of required impurity material can be saved.

According to the fourth aspect of the present invention, effects similar to those obtained in the first aspect by mixing with stirring can be obtained in the second or third aspect.

According to the fifth aspect of the present invention, yield or growth rate of a semiconductor crystal can be suitably or optimally regulated by varying the mixing ratio of lithium (Li) or calcium (Ca) in a flux mixture, and thus productivity of a target electronic-device-forming semiconductor substrate can be suitably or optimally regulated.

According to the sixth aspect of the present invention, foreign substances or impurities are successfully removed from a crystal growth surface on which a semiconductor crystal is to be grown, and therefore a target electronic-device-forming semiconductor substrate can be produced in higher quality through crystal growth.

According to the seventh aspect of the present invention, a semiconductor substrate for an electronic device or an optical device, the substrate having intended electrical conductivity or band gap, can be produced as desired through crystal growth.

According to the eighth aspect of the present invention, there can be produced a crystal growth substrate of high quality at low cost on a practical level, which substrate is useful as a substrate for an electronic device or an optical device (e.g., a light-emitting device (LED or LD) or a photoreceptor), or as a semiconductor wafer substrate for such a device.

Since the semiconductor substrate of the present invention has very high crystal quality as compared with conventional ones, a semiconductor crystal layer formed on the substrate through crystal growth exhibits high crystal quality. Therefore, the aforementioned intended characteristics (e.g., sheet resistance) of the resultant electronic device can be improved, as compared with conventional electronic devices. Also, since the semiconductor substrate exhibits increased thermal conductivity as the crystal quality thereof increases, the substrate exhibits high heat radiation effect as compared with conventional ones.

According to the ninth aspect of the present invention, a reduction in yield of an electronic device or optical device—which would otherwise occur due to breakage or damage to such a semiconductor substrate during production of the electronic device or optical device—can be obviated.

According to the tenth aspect of the present invention, the electronic-device-forming semiconductor substrate of high quality is employed as a crystal growth substrate for an electronic device, and therefore a semiconductor crystal layer constituting the electronic device is formed in high quality.

Therefore, according to the tenth aspect of the present invention, an electronic device exhibiting excellent operational characteristics (e.g., sheet resistance and leakage current) can be produced. When the thickness of the electronic-device-forming semiconductor substrate is regulated to 300 μm or more, yield of a target electronic device can be increased.

According to the eleventh aspect of the present invention, a two-dimensional electron gas can be successfully formed at the interface between a channel layer A and a carrier-supply layer B, and thus a channel in which the gas serves as a carrier can be successfully formed in a field-effect transistor. Therefore, according to the eleventh aspect of the present invention, a field-effect transistor having excellent operational characteristics can be produced.

According to the twelfth aspect of the present invention, the channel layer A or the carrier-supply layer B can be formed of a semiconductor crystal layer of high quality, and thus mobility of carriers can be increased at the aforementioned interface. Therefore, according to the twelfth aspect of the present invention, sheet resistance of the channel layer can be reduced.

According to the thirteenth aspect of the present invention, the difference in band gap between the channel layer A and the carrier-supply layer B can be appropriately maintained, while crystal quality of each of the semiconductor crystal layers is maintained at a high level. Thus, the channel layer A is preferably formed of an undoped GaN crystal layer. Meanwhile, the carrier-supply layer B is preferably formed of an undoped AlGaN crystal layer so as to suppress current leakage to a gate electrode.

According to the fourteenth aspect of the present invention, the interface between the channel layer A and the carrier-supply layer B can be flattened as compared with conventional cases, and thus carrier scattering is less likely to occur at the interface. Therefore, according to the fourteenth aspect of the present invention, the sheet resistance of the channel layer can be reduced.

According to the fifteenth aspect of the present invention, the difference in band gap between the channel layer A and the carrier-supply layer B can be appropriately maintained, while crystal quality of the carrier-supply layer B is maintained at a high level. Therefore, according to the fifteenth aspect of the present invention, while the sheet resistance of the channel layer is reduced, the leakage current of the carrier-supply layer can be reduced.

According to the above-described aspects of the present invention, the aforementioned problems can be readily or reasonably solved.

According to the sixteenth aspect of the present invention, there can be readily mass-produced a semiconductor light-emitting device exhibiting characteristics superior to those of a conventional one, since crystal quality of a crystal growth substrate for the semiconductor light-emitting device can be readily enhanced as compared with conventional cases. Examples of characteristics of the semiconductor light-emitting device improved through enhancement of quality of the crystal growth substrate include internal quantum efficiency, external quantum efficiency, driving voltage, electrostatic breakdown voltage, service life, and yield.

Particularly in the case of a semiconductor laser, an important factor for increasing resonance efficiency of output light in a resonator is that light emitted from a light-emitting layer has a sufficiently narrow half width in a frequency axis direction, or light reflectance is high at the reflection surface of the resonator. Particularly in the case of, for example, an end-surface light-emitting laser, an important point is that end surfaces of a resonator are formed cleanly through cleavage. Particularly in the case of a surface light-emitting laser, an important point is that a crystal growth surface has small roughness (irregularities). Since light emitted from a light-emitting layer is reflected many times in a resonator before being output, transparency of the resonator itself is a very important factor for enhancing output performance. In view of the foregoing, according to the sixteenth aspect of the present invention, output performance of a semiconductor laser can be readily enhanced as compared with conventional cases.

According to the seventeenth aspect of the present invention, there can be readily mass-produced a semiconductor photoreceptor exhibiting characteristics superior to those of a conventional one, since crystal quality of a crystal growth substrate for the semiconductor photoreceptor can be readily enhanced as compared with conventional cases. Examples of characteristics of the semiconductor photoreceptor improved through enhancement of quality of the crystal growth substrate include internal quantum efficiency, external quantum efficiency, driving voltage, electrostatic breakdown voltage, service life, and yield.

According to the eighteenth or nineteenth aspect of the present invention, the carrier mobility and photoluminescence intensity of a group III nitride based compound semiconductor crystal layer containing an acceptor impurity and aluminum can be increased; the surface roughness of the semiconductor crystal layer can be reduced; and variation in, for example, aluminum compositional proportion or thickness between portions of the semiconductor crystal layer can be reduced. This is because, crystal quality of the aluminum-containing group III nitride based compound semiconductor layer is improved through optimization of the nitrogen content of a carrier gas, and thus flat surface morphology is attained. Conceivably, these effects could be due to suppression of occurrence of defects or surface roughening through re-evaporation of atoms from an epitaxially grown crystal.

Provision of such a semiconductor crystal layer can improve the operation efficiency, etc. of an optical device, such as a light-emitting diode (LED), a semiconductor laser (LD), a photoreceptor for use in an imaging device, an optical sensor, or a photocoupler.

According to the twentieth aspect of the present invention, the semiconductor device includes a plurality of voltage-resistant structures, each including two layers; i.e., an undoped semiconductor layer provided on the side of the contact layer, and a doped semiconductor layer provided on the undoped semiconductor layer. That is, a portion of the semiconductor device including the plurality of the voltage-resistant structures, which portion contributes to improvement of electrostatic breakdown voltage, includes at least two doped semiconductor layers. This configuration can successfully reduce concentration of carriers in crystal defects of the device, which would otherwise occur through application of high electrostatic voltage, as compared with conventional cases. Therefore, according to the twentieth aspect of the present invention, electrostatic breakdown voltage of the device can be further improved as compared with conventional cases, while the light-emitting or light-receiving performance (e.g., emission intensity or light-receiving sensitivity) of the device is sufficiently maintained at a level comparative to that of a conventional semiconductor device.

According to the twenty-first aspect of the present invention, when an n-type semiconductor layer is provided on the side near the crystal growth substrate (i.e., on the lower side), and a p-type semiconductor layer is provided on the opposite side (i.e., on the upper side), a plurality of the aforementioned voltage-resistant structures are formed adjacent or close to the contact layer on the side near the crystal growth substrate. Therefore, according to the twenty-first aspect of the present invention, even when a high-temperature growth layer (i.e., a layer which is formed through crystal growth at a temperature higher than the temperature of crystal growth for forming the active layer) is provided in the aforementioned voltage-resistant structures, high-temperature crystal growth for forming the high-temperature growth layer does not cause any thermal damage to the active layer.

Thus, according to the twenty-first aspect of the present invention, when an n-type semiconductor layer is provided on the side near the crystal growth substrate (i.e., on the lower side), and a p-type semiconductor layer is provided on the opposite side (i.e., on the upper side), both crystal quality of the active layer and crystal quality of the aforementioned voltage-resistant structures can be maintained at a high level, and therefore the light-emitting or light-receiving performance of the optical device can be effectively maintained or improved.

According to the twenty-second aspect of the present invention, the external quantum efficiency of the light-emitting device can be improved due to optical reflection effect of the DBR multiple layer, which includes undoped semiconductor crystal layers, as well as electrostatic breakdown voltage of the device can be improved due to electrical conductivity of the undoped layers. Conceivably, this improvement of electrostatic breakdown voltage could be due to, for example, reduction of carrier concentration similar to the case of the twentieth aspect.

According to the twenty-second aspect of the present invention, dislocation density of each of the semiconductor crystal layers can be reduced, since the crystal growth substrate has low dislocation density. Therefore, conceivably, electrostatic breakdown voltage of the semiconductor light-emitting device could be further improved due to the synergistic effect of such crystal quality improvement and provision of the undoped layers.

Since the semiconductor light-emitting device is of a flip-chip type, considerable improvement of transparency of the optical device substrate by the aforementioned operation and effects of the present invention greatly contributes to improvement of the aforementioned external quantum efficiency.

According to the twenty-third aspect of the present invention, a large difference in refractive index between the interfaces of the aforementioned DBR multiple layer can be maintained within a range such that driving voltage or internal quantum efficiency of the light-emitting device is not considerably impaired. Therefore, within such a range, reflectance of the DBR multiple layer can be effectively enhanced.

According to the twenty-fourth aspect of the present invention, foreign substances or impurities are successfully removed from a crystal growth surface on which a semiconductor crystal is to be grown, and therefore a semiconductor crystal layer constituting a target semiconductor optical device can be produced in higher quality through crystal growth.

BRIEF DESCRIPTION OF THE DRAWINGS

FIG. 2-A is a cross-sectional view showing operation of the crystal growth apparatus employed in Embodiment 1.

FIG. 2-B is a cross-sectional view showing operation of the crystal growth apparatus employed in Embodiment 1.

FIG. 2-C is a cross-sectional view showing operation of the crystal growth apparatus employed in Embodiment 1.

FIG. 4-A shows the configuration of a crystal growth apparatus employed in Embodiment 2.

FIG. 4-B is a partial cross-sectional view showing the crystal growth apparatus employed in Embodiment 2.

FIG. 5-A is a cross-sectional view showing a semiconductor crystal grown in Embodiment 2.

FIG. 5-B is a cross-sectional view showing the semiconductor crystal grown in Embodiment 2.

FIG. 5-C is a cross-sectional view showing the semiconductor crystal grown in Embodiment 2.

FIG. 7 is a table showing conditions for fabricating the field-effect transistor 100 and properties thereof.

FIG. 10-A is a schematic perspective view showing an amplifier circuit 300 of Embodiment 5.

FIG. 10-B shows the diagram of the amplifier circuit 300 of Embodiment 5.

Figure 1:
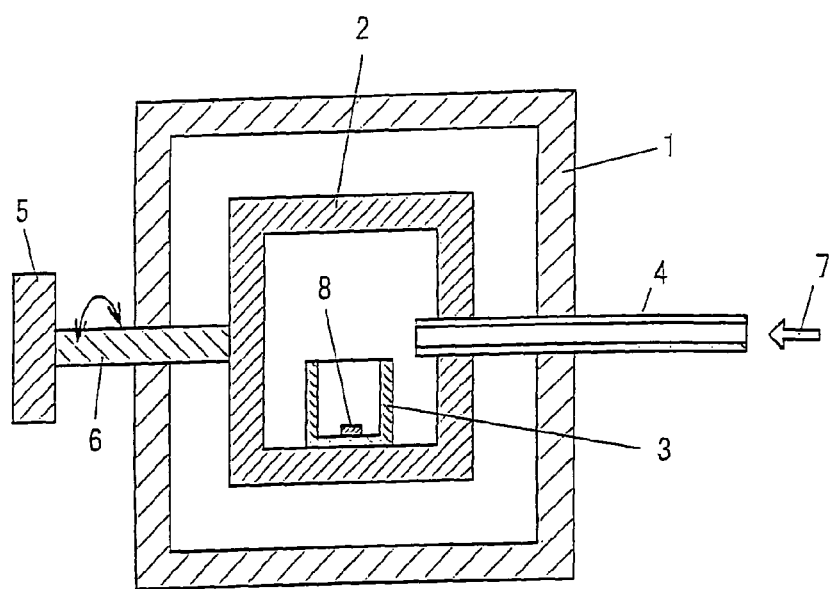
FIG. 1 is a cross-sectional view showing a crystal growth apparatus employed in a first embodiment.

| Description of Reference Numerals | |
|---|---|
| 2: | Reaction chamber |
| 3: | Reaction container |
| 8: | Seed crystal |
| 9: | Flux mixture |
| H: | Heater |
| 10: | Template |
| 20: | Semiconductor substrate |
| 100, 200: | Field-effect transistor |
| 103, 203: | Channel layer |
| 104, 204: | Carrier-supply layer |
| 400: | LED |
| 401: | Semiconductor substrate |
| 407: | p-type AlGaN layer |

BEST MODES FOR CARRYING OUT THE INVENTION

In the second aspect of the present invention, the aforementioned film formation pattern may be formed on an exposed surface of the flux-soluble material through any well-known technique, such as photolithography or etching. The smaller the thickness of a protective film formed on the exposed surface, the earlier the aforementioned dissolution time. The greater the area of a portion of the flux-soluble material exposed to the flux mixture, the higher the aforementioned dissolution rate. Dissolution of the flux-soluble material in the flux mixture starts at the time when the exposed portion of the flux-soluble material comes into contact with the flux mixture of high temperature, and the dissolution rate is almost proportional to the area of the exposed portion. Therefore, the time at which dissolution of the flux-soluble material starts, the time required for dissolution of the flux-soluble material, the dissolution rate, etc. can be arbitrarily controlled by appropriately determining the thickness of the protective film and the area of the exposed portion of the flux-soluble material. The time required for dissolution of the flux-soluble material may be regulated by varying, for example, the type or thickness of the flux-soluble material, or the temperature of the flux mixture.

No particular limitation is imposed on the method for producing a seed crystal or base substrate employed for the aforementioned crystal growth through the flux process, and the seed crystal or base substrate is effectively produced through, for example, the flux process, HVPE, MOVPE, or MBE. No particular limitation is imposed on the size or thickness of the seed crystal or base substrate, but, from the viewpoint of industrial utility, the seed crystal or base substrate preferably assumes, for example, a circular shape having a diameter of about 50 mm to about 150 mm, a square shape having a size of about 27 mm×about 27 mm, or a square shape having a size of about 12 mm×about 12 mm. Preferably, the seed crystal or base substrate has a crystal growth surface with a large curvature radius.

Preferably, the seed crystal or base substrate has a low dislocation density. However, in the case where the method according to any of the second to fourth aspects of the present invention is employed, the seed crystal or base substrate is not necessarily required to have a low dislocation density. It should be noted that, in this case, when the dislocation density is excessively low, the aforementioned flux-soluble material (base substrate) may be difficult to dissolve in the flux mixture.

No particular limitation is imposed on the crystal growth apparatus employed, so long as the flux process can be carried out by means of the apparatus. For example, a crystal growth apparatus described in any of Patent Documents 1 to 5 or modified apparatus thereof may be employed. When crystal growth is performed through the flux process, preferably, the temperature of a reaction chamber of a crystal growth apparatus employed can be arbitrarily raised or lowered to about 1,000° C. Preferably, the pressure of the reaction chamber can be arbitrarily increased or decreased to about 100 atm (about $1.0 \times 10^7$ Pa). The electric furnace, reaction container, raw material gas tank, piping, etc. of a crystal growth apparatus employed are preferably formed of, for example, a stainless steel (SUS) material, an alumina material, or copper.

Particularly in the case where a field-effect transistor according to the fourteenth aspect of the present invention is produced, important parameters determining crystal growth conditions for suppressing sublimation of atoms constituting a surface portion of the channel layer A are, for example, crystal growth temperature, the partial pressure of a gaseous material, the type of a carrier gas employed, the partial pressure of the carrier gas, V/III ratio, and crystal growth rate. Therefore, when, for example, Ga atoms constituting a GaN crystal are particularly readily sublimated, the partial pressure of a gaseous material (e.g., trimethylgallium (TMG)) may be relatively or absolutely increased, or a similar measure may be taken.

In this case, preferably, the temperature of crystal growth for the carrier-supply layer B ($T_B$), is regulated to be lower than the temperature of crystal growth for the channel layer A ($T_A$).

In order to prevent roughening of the interface between these layers, effectively, the pressure of crystal growth for the carrier-supply layer B ($P_B$), is regulated to be nearly equal to the pressure of crystal growth for the channel layer A ($P_A$).

Particularly preferably, the aluminum compositional proportion x in the channel layer A formed of $Al_xGa_{1-x}N$ ($0 \leq x < 1$) is regulated to almost zero, and the aluminum compositional proportion y in the carrier-supply layer B formed of $Al_yGa_{1-y}N$ ($x < y \leq 1$) is regulated to 0.15 to 0.30. In this case, preferably, the crystal growth pressures $P_A$ and $P_B$ are regulated to almost ambient pressure, and the crystal growth temperatures $T_A$ and $T_B$ are regulated so as to satisfy the following relationship: $950° C. \leq T_B < T_A$.

More preferably, the temperature of crystal growth for the channel layer A ($T_A$) is regulated to 1,200° C. or lower. It is important that the temperature of crystal growth for the channel layer A ($T_A$) be regulated to be higher, by 50° or more, than the temperature of crystal growth for the carrier-supply layer B ($T_B$). This temperature difference more preferably falls within a range of 50° to 150°.

More preferably, the temperature of crystal growth for the carrier-supply layer B ($T_B$) is regulated so as to satisfy the following relationship: $950° C. \leq T_B < 1,050° C$. In the fourteenth aspect of the present invention, preferably, the temperature of crystal growth for the channel layer A ($T_A$) is regulated so as to satisfy the following relationship: $1,050° C. < T_A \leq 1,150° C$.

Preferably, the aluminum compositional proportion in the channel layer A is regulated to almost zero, and the aluminum compositional proportion in the carrier-supply layer B is regulated to 0.15 to 0.30. It is important that the thickness of the carrier-supply layer B is regulated to 1 nm or more. The thickness of the carrier-supply layer B is more preferably 5 nm or more.

With the above-described optimization, the interface between the channel layer A and the carrier-supply layer B of the field-effect transistor according to the fourteenth aspect of the present invention can be effectively flattened.

Particularly in the case where a field-effect transistor according to the fifteenth aspect of the present invention is produced, preferably, the aluminum compositional proportion x1 in the carrier-supply layer B as determined at the aforementioned interface is regulated to 0.15 to 0.40. More preferably, the aluminum compositional proportion X1 is regulated to 0.19 to 0.25.

In this case, preferably, the aluminum compositional proportion x2 in the carrier-supply layer B as determined at the surface opposite the aforementioned interface is regulated to 0.05 to 0.20. More preferably, the aluminum compositional proportion x2 is regulated to 0.13 to 0.17.

In a particularly preferred embodiment of the field-effect transistor according to the fifteenth aspect of the present invention, the aluminum compositional proportion x in the carrier-supply layer B is generally reduced monotonously from 0.20 to 0.15 as the distance from the aforementioned interface increases.

In the case where an optical device according to the twentieth or twenty-first aspect of the present invention is produced, particularly when, for example, the aforementioned active layer is formed so as to emit or receive light having a wavelength of 450 nm to 480 nm, more preferably, the total of the sum of the thicknesses of the semiconductor layers constituting the second and subsequent voltage-resistant structures as counted from the aforementioned contact layer and the thickness of the doped semiconductor layer constituting the first voltage-resistant structure as counted from the contact layer is regulated to 140 nm to 600 nm.

With this configuration, electrostatic breakdown voltage of the device can be improved as compared with conventional devices, while the light-emitting or light-receiving performance thereof is maintained at a level equal to or higher than that of a conventional device. When the total thickness is excessively large, light-emitting or light-receiving performance is impaired for the below-described (reason 1) or (reason 2), whereas when the total thickness is excessively small, resistance of the semiconductor layers per se is excessively reduced, and difficulty is encountered in improving the electrostatic breakdown voltage.

(Reason 1) Resistance of the undoped semiconductor layer itself becomes excessively large.

(Reason 2) When the undoped semiconductor layer is formed through crystal growth at a relatively low temperature of about 800° C. to about 900° C. as described hereinbelow, the surface of the undoped semiconductor layer may be appropriately roughened. In this case, when the thickness of the undoped semiconductor layer is excessively large, due to its surface roughness, difficulty is encountered in maintaining, at a high level, crystal quality of the undoped semiconductor layer or a semiconductor layer (e.g., an active layer) which is subsequently formed through crystal growth.

Particularly when, for example, the aforementioned active layer is formed so as to emit or receive light having a wavelength of 510 nm to 550 nm, more preferably, the total of the sum of the thicknesses of the semiconductor layers constituting the second and subsequent voltage-resistant structures as counted from the aforementioned contact layer and the thickness of the doped semiconductor layer constituting the first voltage-resistant structure as counted from the contact layer is regulated to 50 nm to 250 nm.

With this configuration, electrostatic breakdown voltage of the device can be improved as compared with conventional devices, while light-emitting or light-receiving performance thereof is maintained at a level equal to or higher than that of a conventional device. When the total thickness is excessively large, the light-emitting or light-receiving performance is impaired due to the above-described (reason 1) or (reason 2), whereas when the total thickness is excessively small, resistance of the semiconductor layers per se is excessively reduced, and difficulty is encountered in improving the electrostatic breakdown voltage.

More preferably, the thickness of the undoped semiconductor layer constituting the first voltage-resistant structure as counted from the contact layer is regulated to 100 nm to 300 nm. When the thickness is excessively large, light-emitting or light-receiving performance is impaired due to the above-described (reason 1), whereas when the thickness is excessively small, resistance of the undoped semiconductor layer per se is excessively reduced, and difficulty is encountered in improving the electrostatic breakdown voltage.

More preferably, the thickness of the doped semiconductor layer constituting the first voltage-resistant structure as counted from the contact layer is regulated to 10 nm to 100 nm. When the thickness is excessively large, light-emitting or light-receiving performance is impaired due to the above-described (reason 2), whereas when the thickness is excessively small, carriers are insufficiently distributed in a lateral direction, and difficulty is encountered in improving the electrostatic breakdown voltage.

More preferably, the thickness of the doped semiconductor layer constituting the second voltage-resistant structure as counted from the contact layer is regulated to 20 nm to 40 nm. When the thickness is excessively large, light-emitting or light-receiving performance is impaired due to the above-described (reason 2), whereas when the thickness is excessively small, carriers are insufficiently distributed in a lateral direction, and difficulty is encountered in improving the electrostatic breakdown voltage.

As used herein, "group III nitride based compound semiconductor," which is a material for forming a semiconductor substrate or growing a semiconductor layer on the semiconductor substrate, generally encompasses two-component semiconductors, three-component semiconductors, and four-component semiconductors which are represented by the formula: $Al_{1-x-y}Ga_yIn_xN$ ($0 \leq x \leq 1$, $0 \leq y \leq 1$, $0 \leq 1-x-y \leq 1$) and have arbitrary compound crystal proportions, and also encompasses such semiconductors containing a p-type or n-type impurity.

At least a portion of the aforementioned group III element (Al, Ga, or In) atoms may be substituted by, for example, boron (B) or thallium (Tl); or at least a portion of nitrogen (N) atoms may be substituted by, for example, phosphorus (P), arsenic (As), antimony (Sb), or bismuth (Bi).

The aforementioned p-type impurity (acceptor) added may be, for example, a known p-type impurity such as magnesium (Mg) or calcium (Ca).

The aforementioned n-type impurity (donor) added may be, for example, a known n-type impurity such as silicon (Si), sulfur (S), selenium (Se), tellurium (Te), or germanium (Ge).

Two or more impurity (acceptor or donor) elements may be added in a single step, or both p-type and n-type impurities may be added in a single step.

For the production of the aforementioned electronic device or optical device, a group III nitride based compound semiconductor layer is formed on a semiconductor substrate through crystal growth by using, as an effective technique, molecular beam epitaxy (MBE), metal-organic vapor phase epitaxy (MOVPE), hydride vapor phase epitaxy (HVPE), liquid phase epitaxy, or the like.

The light-emitting layer or the active layer may have a single-layer structure, a single quantum well (SQW) structure, a multiple quantum well (MQW) structure, or another structure. Particularly when the semiconductor crystal layer has a multiple quantum well (MQW) structure, preferably, the layer includes at least a well layer formed of an indium (In)-containing group III nitride based compound semiconductor $Al_yGa_{1-y-z}In_zN$ ($0 \leq y<1$, $0<z \leq 1$). Thus, the light-emitting layer or the active layer may include, for example, a well layer formed of doped or undoped $Ga_{1-z}In_zIn$ ($0<z \leq 1$), and a barrier layer which has a band gap greater than that of the well layer and is formed of a group III nitride based compound semiconductor AlGaInN having arbitrary compositional proportions.

Specific embodiments of the present invention will next be described.

However, the present invention is not limited to the below-described embodiments.

Embodiment 1

FIG. 1 is a cross-sectional view showing a crystal growth apparatus employed in Embodiment 1.

1. Crystal Growth Apparatus

This crystal growth apparatus is employed for growing a target semiconductor crystal on the crystal growth surface of a substrate 8 through the flux process. A heating container 2 provided in the interior of a heat-resistant, pressure-resistant container 1 is connected to a gas feed pipe 4 for feeding a nitrogen-containing gas 7. A shaft 6 extending from a swinging apparatus 5 is connected to the heating container 2 on the side opposite the gas feed pipe 4 such that the shaft 6 is coaxial with the gas feed pipe 4. The swinging apparatus 5 includes, for example, a motor and a motor controller. A flux mixture and the aforementioned substrate 8 are placed in a reaction container 3 formed of boron nitride.

2. Crystal Growth Through the Flux Process

Next will be described growth of a gallium nitride single crystal by means of the crystal growth apparatus shown in FIG. 1.

(1) Firstly, a GaN film (thickness: 3 μm) was formed on the crystal growth surface of a sapphire substrate through MOVPE, to thereby yield the substrate 8 shown in FIG. 1.

(2) Subsequently, the substrate 8 was placed on the bottom of the reaction container 3, and then sodium (Na) (about 8.8 g) and lithium (Li) (about 0.027 g) were placed in the reaction container 3. The ratio by mole of Na to Li is 99:1.

(3) Subsequently, the reaction container 3 was placed in the heating container 2, and the reaction container 3 was inclined in a predetermined direction so that the substrate 8 did not come into contact with a flux mixture of sodium (Na) and lithium (Li).

(4) Subsequently, nitrogen gas ($N_2$) heated to about 1,000° C. was fed into the reaction chamber for about 30 minutes, to thereby clean the crystal growth surface of the substrate 8. During this cleaning, the gas pressure in the heating container 2 was periodically varied within a range of 0 to 10 atm (1 to $10 \times 10^5$ Pa) or thereabouts so that nitrogen ($N_2$) gas was fed (compressed) into and discharged from the heating container 2 in a repeated manner, to thereby perform influx/discharge of the cleaning gas.

(5) Thereafter, nitrogen gas was newly fed into the heating container 2; the gas pressure in the container was increased to 10 atm (about $10 \times 10^5$ Pa); and the temperature of the container was adjusted at 890° C.

(6) Thereafter, as shown in FIGS. 2-A, 2-B, and 2-C, a liquid raw material (flux mixture) 9 was moved from side to side by swinging the reaction container 3 by means of the swinging apparatus 5, so that the crystal growth surface of the GaN film was always thinly covered with the flux mixture 9. While this swinging was continued, the aforementioned temperature and pressure were maintained constant for four hours. In this case, swinging may be performed so that the flux is reciprocated once to several times per minute.

(7) Thereafter, while the reaction container 3 was inclined so that the flux mixture did not come into contact with the substrate 8, the aforementioned temperature and pressure were lowered to about ambient temperature and ambient pressure, respectively, and then the substrate 8 was removed from the heating container 2. Subsequently, the flux mixture (Na and Li) deposited onto the periphery of the substrate 8 was removed with ethanol, to thereby yield a transparent GaN single crystal in bulk form grown on the substrate 8 and having a uniform thickness.

Thereafter, the sapphire substrate is removed through, for example, polishing or a laser lift-off technique.

The GaN single crystal produced through the above-described method was found to have a thickness of about 10 μm and a maximum size of 5 cm or more.

Photoluminescence intensity of the GaN single crystal was measured at ambient temperature, and was found to be 10 mW or more with respect to excitation light of 325 nm.

The half width of an XRD peak attributed to an X-ray reflected by a (100) plane was found to be 100 arc.sec. or less.

These data show that when, for example, the above-described crystal growth process is carried out for about 160 hours, there can be produced a transparent semiconductor substrate of high quality for fabricating an electronic device or an optical device, the substrate having a thickness of 400 μm and a low dislocation density.

In the above-described crystal growth process, the secondary component of the flux mixture is lithium (Li). However, the secondary component of the flux mixture may be calcium (Ca) in place of lithium (Li). Alternatively, lithium (Li) may be employed together with calcium (Ca).

When an impurity; for example, boron (B), thallium (Tl), calcium (Ca), a Ca-containing compound, silicon (Si), sulfur (S), selenium (Se), tellurium (Te), carbon (C), oxygen (O), aluminum (Al), indium (In), alumina ($Al_2O_3$), indium nitride (InN), silicon nitride ($Si_3N_4$), silicon oxide ($SiO_2$), indium oxide ($In_2O_3$), zinc (Zn), iron (Fe), magnesium (Mg), zinc oxide (ZnO), magnesium oxide (MgO), or germanium (Ge), is added to the aforementioned flux mixture, a target GaN single crystal can be doped with such an impurity. Through such a doping technique, a target semiconductor substrate for an electronic device or an optical device can be provided with electrical conductivity or semi-insulating property.

The nitrogen (N)-containing gas, which is a raw material for forming the crystals, may be, for example, nitrogen gas ($N_2$), ammonia gas ($NH_3$), or a mixture of these gases. In a group III nitride based compound semiconductor represented by the aforementioned compositional formula, which constitutes a target semiconductor crystal, at least a portion of the aforementioned group III element (Al, Ga, or In) atoms may be substituted by, for example, boron (B) or thallium (Tl); or at least a portion of nitrogen (N) atoms may be substituted by, for example, phosphorus (P), arsenic (As), antimony (Sb), or bismuth (Bi).

A p-type impurity (acceptor) added may be, for example, an alkaline earth metal (e.g., magnesium (Mg) or calcium (Ca)). An n-type impurity (donor) added may be, for example, silicon (Si), sulfur (S), selenium (Se), tellurium (Te), or germanium (Ge). Two or more impurity (acceptor or donor) elements may be added in a single step, or both p-type and n-type impurities may be added in a single step. Such an impurity can be added to a target semiconductor crystal by, for example, dissolving the impurity in the flux mixture in advance.

Embodiment 2

Figure 3:
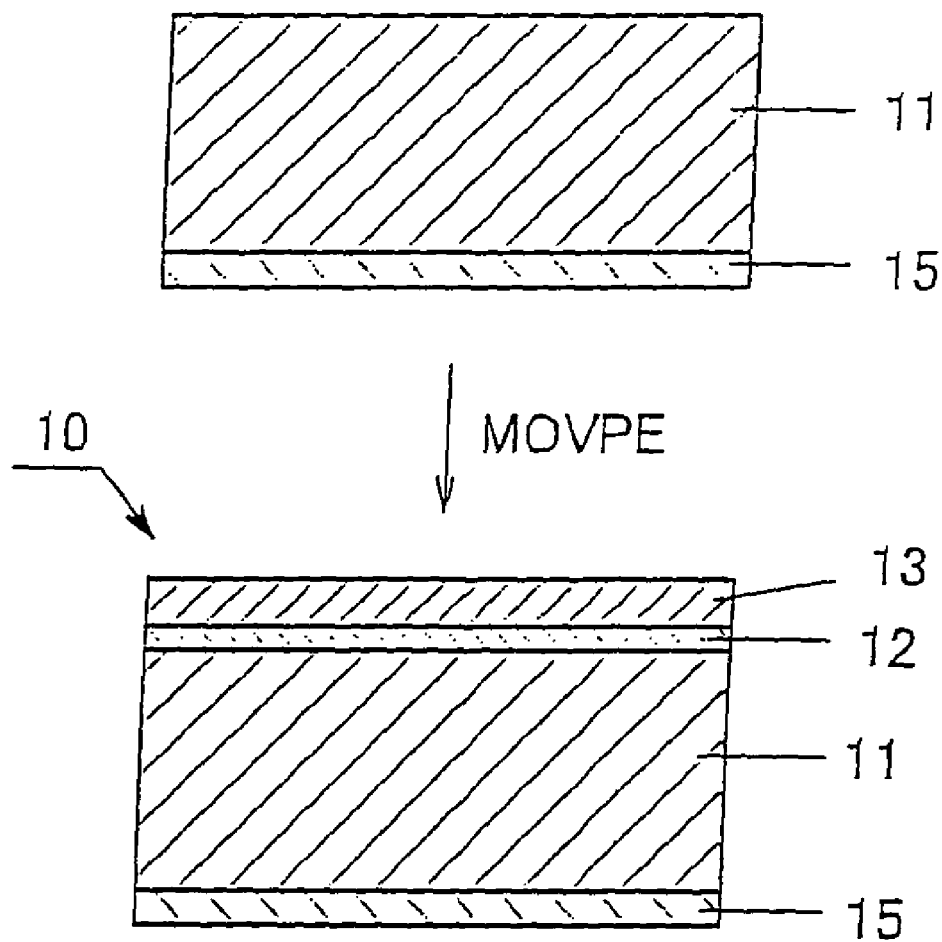
FIG. 3 is a cross-sectional view showing a template 10 prepared in Embodiment 2.

Next will be described, with reference to FIG. 3, a procedure for preparing a base substrate (template 10) employed in the crystal growth step of the flux process in Embodiment 2.

1. Preparation of Base Substrate (1) Firstly, a protective film 15 is formed on the back surface of a silicon substrate 11 (flux-soluble material). The protective film 15 may be formed by providing an AlN layer on the substrate through MOVPE or a similar technique. Alternatively, the protective film 15 may be formed of an appropriate metal such as tantalum (Ta) by means of a sputtering apparatus or a vacuum deposition apparatus.

(2) Subsequently, through crystal growth by MOVPE, an AlGaN buffer layer 12 (thickness: about 4 μm) is formed on the silicon substrate 11 (thickness: about 400 μm), and a GaN layer 13 is formed on the buffer layer 12. The GaN layer 13 can happen to be dissolved in a flux to some extent by the time when growth of a target semiconductor crystal is initiated in the flux process. Therefore, the GaN layer 13 is formed to have such a thickness that it is not completely dissolved in the flux mixture until crystal growth is initiated.

The template 10 (base substrate) can be prepared through the above-described steps (1) and (2).

2. Configuration of Crystal Growth Apparatus

FIGS. 4-A and 4-B show the configuration of a crystal growth apparatus employed in Embodiment 2. The crystal growth apparatus includes a raw material gas tank 21 for supplying nitrogen gas; a pressure regulator 22 for regulating the pressure of a crystal growth atmosphere; a leakage valve 23; and an electric furnace 25 for performing crystal growth. The electric furnace 25, the pipe for connecting the raw material gas tank 21 to the electric furnace 25, etc. are formed of, for example, a stainless steel (SUS) material, an alumina material, or copper.

The electric furnace 25 includes a stainless steel container 24 (reaction chamber) therein, and the stainless steel container 24 includes a crucible 26 (reaction container) therein. The crucible 26 may be formed of, for example, boron nitride (BN) or alumina ($Al_2O_3$).

The temperature of the interior of the electric furnace 25 can be arbitrarily raised or lowered within a range of 1,000° C. or lower. The crystal growth pressure of the interior of the stainless steel container 24 can be arbitrarily increased or decreased within a range of $1.0 \times 10^7$ Pa or less by means of, for example, the pressure regulator 22 or 29 or the leakage valve 23 via a pipe 28.

FIG. 4-B is a cross-sectional view showing the stainless steel container 24. The reaction chamber is defined by a cylindrical side wall 27, and a ring-shaped heater H is provided on an outer bottom portion of the side wall 27. The heater H is provided for heating the crucible 26 (reaction container) via the bottom of the reaction chamber, to thereby cause thermal convection to occur in a flux mixture 9 contained in the crucible 26.

3. Crystal Growth Step

Next will be described, with reference to FIGS. 5-A to 5-C, the crystal growth step in the present embodiment by means of the crystal growth apparatus shown in FIGS. 4-A and 4-B.

(1) Firstly, sodium (Na), lithium (Li), and Ga (i.e., a group III element) are placed in the reaction container (crucible 26), and the reaction container (crucible 26) is placed in the reaction chamber (stainless steel container 24) of the crystal growth apparatus, followed by evacuation of the gas contained in the reaction chamber. The ratio by mole of sodium (Na) to lithium (Li) was 99:1. If necessary, any of the aforementioned additives (e.g., an alkaline earth metal) may be added to the crucible in advance. Setting of the substrate or the raw material in the reaction container is carried out in a glove box filled with an inert gas (e.g., Ar gas), since, when such an operation is performed in air, Na is immediately oxidized.

(2) Subsequently, the gas pressure in the reaction chamber is periodically varied within a range of 0 to 10 atm (1 to about $10 \times 10^5$ Pa) or thereabouts so that nitrogen ($N_2$) gas is fed (compressed) into and discharged from the reaction chamber in a repeated manner, to thereby clean the crystal growth surface of the substrate. This cleaning is performed at 900° C. for about 30 minutes.

(3) Subsequently, while the temperature of the crucible is regulated to 850° C. to 880° C., nitrogen gas ($N_2$) is newly fed into the reaction chamber of the crystal growth apparatus, and the gas pressure in the reaction chamber is maintained at 3 to 5 atm (3 to $5 \times 10^5$ Pa) or thereabouts. In this case, the protective film 15 of the above-prepared template 10 is immersed in a melt (flux mixture) formed through the above temperature rising, and the crystal growth surface of the template 10 (i.e., the exposed surface of the GaN layer 13) is located in the vicinity of the interface between the melt and the nitrogen gas.

(4) Thereafter, thermal convection is generated in the flux mixture 9 by means of heat from the heater H shown in FIG. 4-B, whereby the crystal growth conditions described above in (3) are continuously maintained while the flux mixture is stirred.

Under the above-described conditions, the elements constituting the material for a group III nitride based compound semiconductor are continuously in a supersaturated state in the vicinity of the interface between a Ga—Na melt and the nitrogen gas. Therefore, as shown in FIG. 5-A, a target semiconductor crystal (n-type GaN single crystal 20) can be successfully grown on the crystal growth surface of the template 10 (FIG. 3). The reason why the n-type electrically conductive semiconductor crystal (n-type GaN single crystal 20) is obtained is that Si, which constitutes the silicon substrate 11 dissolved in the flux mixture, is added as an n-type additive to the crystal during growth thereof (FIG. 5-B).

The protective film 15 may be formed to have a large thickness so that the silicon substrate 11 is not dissolved in the flux mixture during the crystal growth step. In this case, there can be formed a semi-insulating electronic-device-forming semiconductor substrate or optical device substrate which is not doped with silicon (Si).

4. Dissolution of Crystal Growth Substrate

After the n-type GaN single crystal 20 is grown to have a sufficient thickness (e.g., about 500 μm or more) through the above-described crystal growth step, the temperature of the crucible is continued to be maintained at 850° C. to 880° C. until the protective film 15 and the silicon substrate 11 are completely dissolved in the flux mixture (FIGS. 5-B and 5-C). Thereafter, while the pressure of the nitrogen gas ($N_2$) is maintained at 3 to 5 atm (3 to $5 \times 10^5$ Pa) or thereabouts, the temperature of the reaction chamber is lowered to 100° C. or less.

The step of dissolving the silicon substrate 11 in the flux mixture and the above temperature lowering step may be carried out partially in parallel. Also, at least a portion of the protective film 15 or the silicon substrate 11 may be dissolved in the flux mixture as described above during growth of the GaN single crystal 20. The parallel/simultaneous mode in which these steps are carried out may be appropriately adapted for, for example, the formation of the protective film 15.

5. Removal of Flux

Subsequently, the above-grown n-type GaN single crystal 20 (target semiconductor crystal) is removed from the reaction chamber of the crystal growth apparatus, and the single crystal is cooled to 30° C. or lower. Thereafter, while the temperature of an atmosphere surrounding the n-type GaN single crystal 20 is maintained at 30° C. or lower, the flux (Na) deposited on the periphery of the single crystal is removed by use of ethanol.

When the above-described steps are sequentially carried out, there can be produced, through the flux process and at low cost, an electrically conductive semiconductor substrate (n-type GaN single crystal 20) of high quality for fabricating an electronic device or an optical device, which substrate has a thickness of 400 μm or more and has considerably reduced cracks as compared with conventional semiconductor substrates. In the case where an impurity (e.g., Fe) is added to the flux mixture, the conduction property of the resultant semiconductor substrate can be controlled by varying the amount of the impurity added. Therefore, addition of such an impurity facilitates production of, for example, a semi-insulating semiconductor substrate for an electronic device or an optical device.

Embodiment 3

Figure 6:
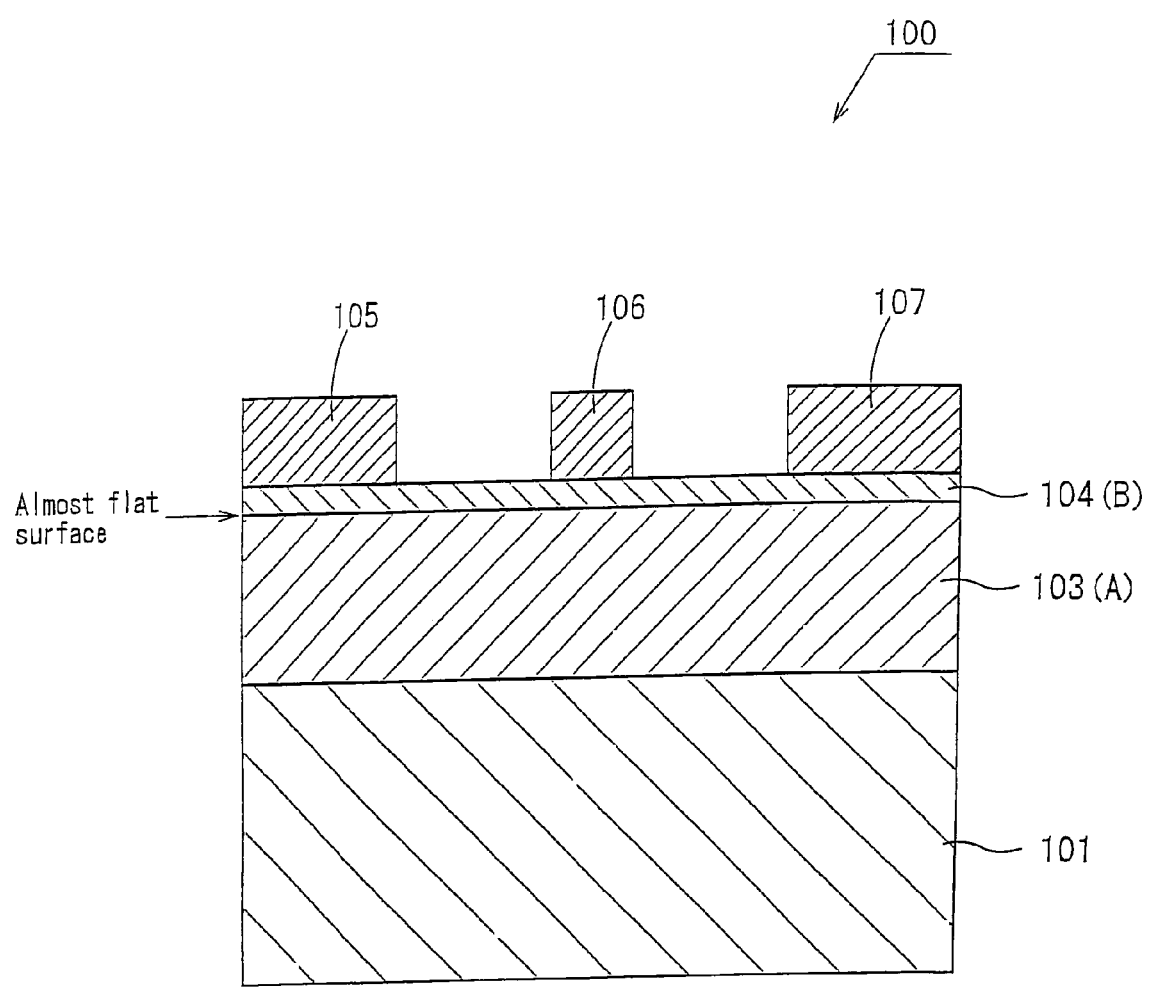
FIG. 6 is a cross-sectional view showing the layered structure of a field-effect transistor 100 of Embodiment 3.

FIG. 6 is a schematic cross-sectional view showing the layered structure of a field-effect transistor 100 of Embodiment 3. The field-effect transistor 100 is a semiconductor device formed by successively providing group III nitride based compound semiconductor layers through crystal growth. A crystal growth substrate 101 of the transistor is formed of an impurity-undoped semi-insulating GaN crystal in bulk form of excellent crystallinity having a thickness of about 400 μm, the GaN crystal being produced through the production method described above in Embodiments 1 or 2.

An undoped GaN semiconductor layer 103 (thickness: about 2 μm) is formed on the crystal growth substrate 101. The semiconductor layer 103 corresponds to the channel layer A according to the eleventh aspect of the present invention. On the semiconductor layer 103 (channel layer A) is formed an undoped $Al_{0.25}Ga_{0.75}N$ semiconductor layer 104 (thickness: about 35 nm) corresponding to the carrier-supply layer B according to the eleventh aspect of the present invention. The thickness of the semiconductor layer 104 (carrier-supply layer B) is regulated so that when the gate is ON, the tunnel effect of carriers (electrons) is effectively ensured between the below-described ohmic electrode 105 or 107 and a two-dimensional electron gas layer formed in the vicinity of the interface between the semiconductor layers A and B.

Reference numerals 105, 106, and 107 denote a source electrode (ohmic electrode), a gate electrode (Schottky electrode), and a drain electrode (ohmic electrode), respectively. Each of the ohmic electrodes (the source electrode 105 and the drain electrode 107) is formed by providing a thin titanium (Ti) layer (thickness: about 100 Å) on the layer 104 through vapor deposition, and providing an aluminum (Al) layer (thickness: about 3,000 Å) on the Ti layer through vapor deposition. These ohmic electrodes are well deposited and alloyed through thermal treatment at about 700° C. to about 900° C. (flash annealing) for less than one second. Meanwhile, the gate electrode 106 (Schottky electrode) is formed by providing a nickel (Ni) layer (thickness: about 100 Å) on the layer 104 through vapor deposition, and providing a gold (Au) layer (thickness: about 3,000 Å) on the Ni layer through vapor deposition.

Next will be described the method for producing the aforementioned field-effect transistor 100 with focusing on the semiconductor crystal layers A and B according to the eleventh aspect of the present invention (i.e., the aforementioned semiconductor layers 103 and 104).

Each of the semiconductor layers 103 and 104 of the aforementioned field-effect transistor 100 is formed through crystal growth by metal-organic vapor phase epitaxy (MOVPE). This crystal growth process employs, for example, carrier gas ($H_2$ or $N_2$), ammonia ($NH_3$) gas, trimethylgallium (Ga($CH_3$)$_3$), and trimethylaluminum (Al($CH_3$)$_3$) gas.

FIG. 7 shows crystal growth conditions under which the semiconductor layers A and B of the field-effect transistor 100 of Embodiment 3 are formed. As shown in FIG. 7, the aforementioned undoped GaN semiconductor crystal layer 103 (thickness: about 2 μm) (i.e., the channel layer A according to the present invention) constituting the field-effect transistor 100 was formed through crystal growth under the following conditions.

(Crystal Growth Conditions for the Semiconductor Layer A)
(1) Crystal growth temperature $T_A$: 1,100[° C.]
(2) Crystal growth pressure $P_A$: 1,013[hPa]

Subsequently, the aforementioned undoped $Al_{0.25}Ga_{0.75}N$ semiconductor crystal layer 104 (thickness: about 35 nm) (i.e., the carrier-supply layer B according to the eleventh aspect of the present invention) was formed through crystal growth under the following conditions.

(Crystal Growth Conditions for the Semiconductor Layer B)
(1) Crystal growth temperature $T_B$: 1,000[° C.]
(2) Crystal growth pressure $P_B$: 1,013[hPa]

A characteristic feature of the aforementioned conditions resides in that the crystal growth temperatures $T_A$ and $T_B$ and crystal growth pressures $P_A$ and $P_B$ for the first and second semiconductor layers A and B (semiconductor layers 103 and 104) satisfy the below-described relationship (2). For comparison with Embodiment 3, typical crystal growth conditions for producing a conventional transistor 900 (FIG. 11) are described in the below-described relationship (1).

(Conventional Crystal Growth Conditions)
$$T_B > T_A, P_B < P_A \quad (1)$$

(Crystal Growth Conditions in Embodiment 3)
$$1{,}000° \text{ C.} = T_B < T_A = 1{,}100° \text{ C.}, P_B = P_A = \text{(ambient pressure)} \quad (2)$$

Under the crystal growth conditions described in the relationship (2), after the semiconductor layer 103 (channel layer A) is formed to have a thickness of 2 the temperature in the crystal growth furnace is lowered, and the crystal growth pressure is maintained at about ambient pressure.

Figure 11:
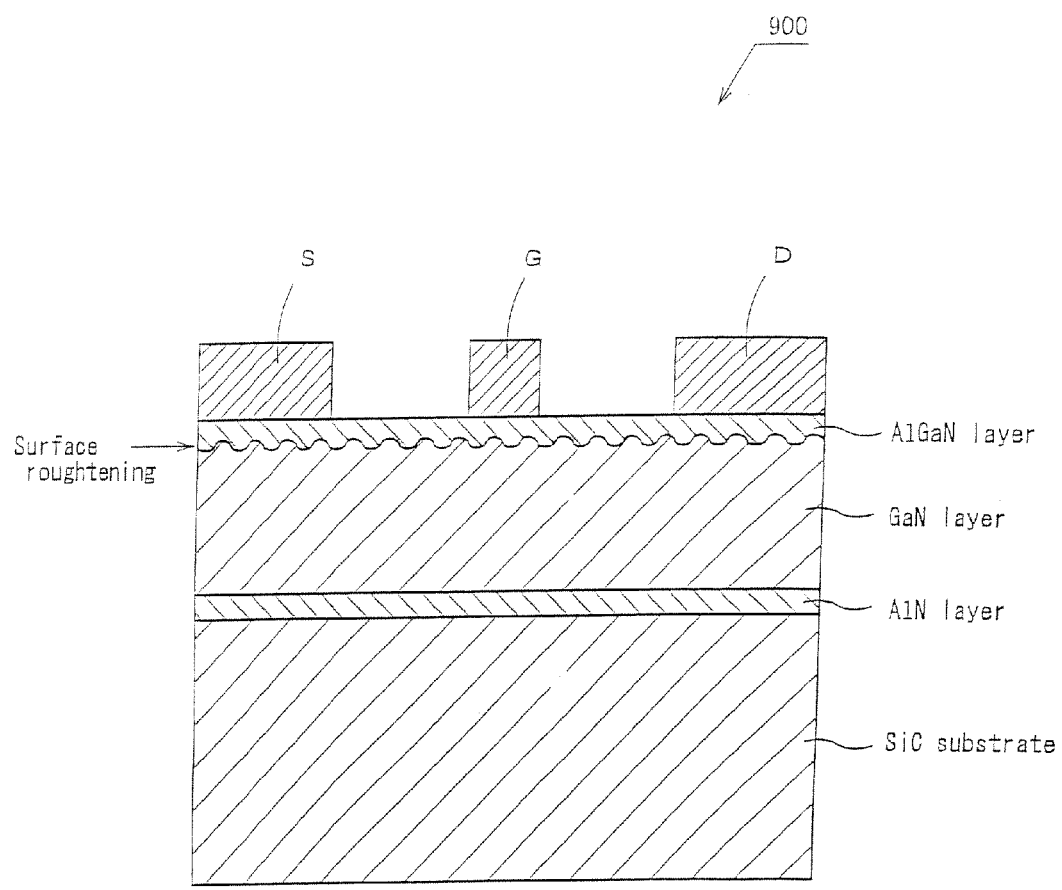
FIG. 11 is a cross-sectional view showing the layered structure of a conventional field-effect transistor 900.

In the conventional case shown in FIG. 11, since the semiconductor layers 103 and 104 are formed under the crystal growth conditions described in the relationship (1), undesirable irregularities are formed at the interface between these layers; i.e., interface roughening occurs, and thus the mobility of two-dimensional electron gas may fail to be maintained at a high level. That is, carrier scattering is very likely to occur at such an interface.

In contrast, when the semiconductor layer 103 (channel layer A) is formed under the crystal growth conditions in Embodiment 3 (described above in the relationship (2)), sublimation of atoms constituting the upper surface of the semiconductor layer 103 can be effectively suppressed, and thus roughening of the interface between the semiconductor layers 103 and 104 can be effectively prevented.

As shown in rows "properties" of FIG. 7, the ON current. I of the field-effect transistor 100 of Embodiment 3 was found to be 1.1 [A/mm], which is higher than that of the transistor 900 (i.e., 0.7 [A/mm]); the sheet resistance p of the transistor 100 was found to be 400 [Ω/square], which is lower than that of the transistor 900 (i.e., 650 [Ω/square]); and the channel mobility μ of the transistor 100 was found to be about 1,600 [$cm^2$/Vsec], which is considerably higher than that of the transistor 900 (i.e., about 1,000 [$cm^2$/Vsec]).

Thus, the field-effect transistor 100 exhibits excellent electrical properties, which are comparable to a sheet carrier concentration of the channel layer (two-dimensional electron gas) of about $1 \times 10^{13}$ [$cm^{-2}$]. As described above, according to the configuration and production method for the field-effect transistor 100 of Embodiment 3, device electrical properties can be considerably improved as compared with conventional cases.

The aforementioned effect of suppressing interface roughening is also based on that the crystal growth substrate 101 is formed of an impurity-undoped semi-insulating GaN crystal in bulk form of excellent crystallinity having a thickness of about 400 µm, the GaN crystal being produced through the production method described above in Embodiment 1. That is, employment of a crystal growth substrate of very high crystal quality is a very effective and important factor for flattening the interface between semiconductor crystal layers formed on the substrate through crystal growth. Therefore, employment of the electronic-device-forming semiconductor substrate of the present invention is particularly effective.

Embodiment 4

Figure 8:
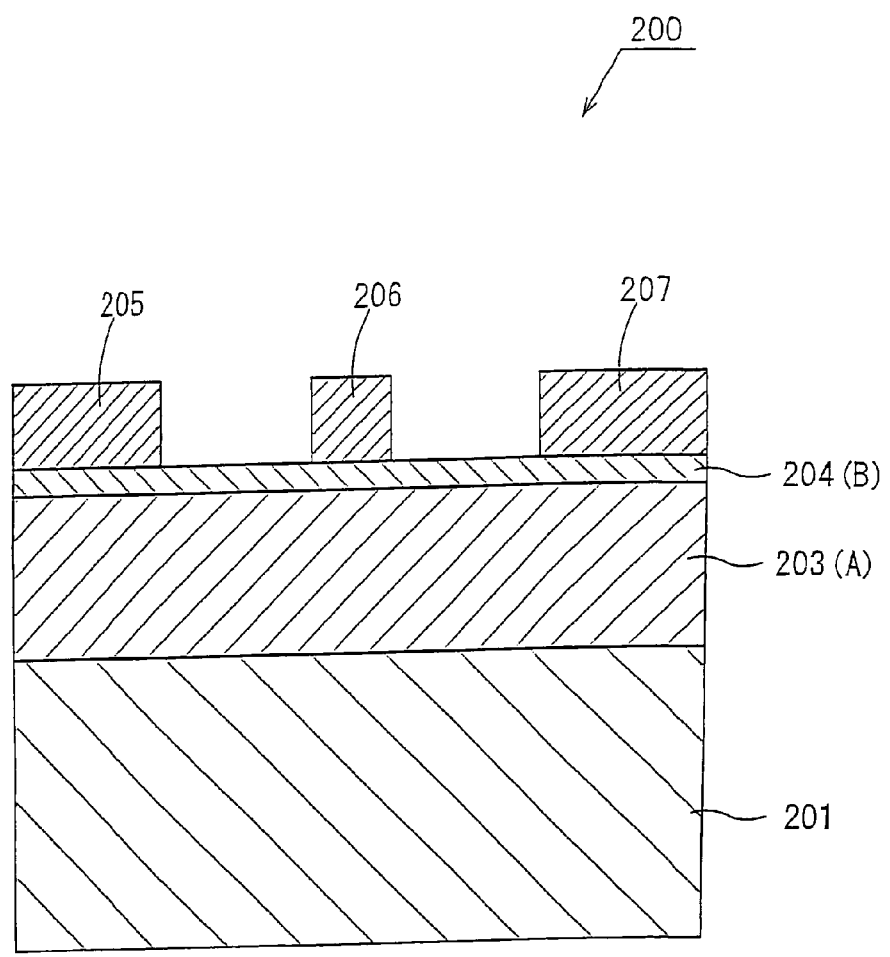
FIG. 8 is a cross-sectional view showing a field-effect transistor 200 of Embodiment 4.

FIG. 8 is a schematic cross-sectional view showing the layered structure of a field-effect transistor 200 of Embodiment 4. The field-effect transistor 200 is a semiconductor device formed by successively providing group III nitride based compound semiconductor layers through crystal growth. A crystal growth substrate 201 of the transistor is formed of an impurity (Fe)-doped semi-insulating GaN crystal in bulk form of excellent crystallinity having a thickness of about 400 µm, the GaN crystal being produced through the production method described above in Embodiment 1 or 2.

An undoped GaN semiconductor crystal layer 203 (thickness: about 2 µm) is formed on the crystal growth substrate 201. The semiconductor crystal layer 203 corresponds to the channel layer A according to the eleventh aspect of the present invention. On the semiconductor crystal layer 203 (channel layer A) is formed an undoped $Al_xGa_{1-x}N$ ($0.15 \leq x \leq 0.20$) semiconductor crystal layer 204 (thickness: about 400 Å) corresponding to the carrier-supply layer B according to the eleventh aspect of the present invention.

The aluminum compositional proportion x in the semiconductor crystal layer 204 is monotonously reduced from 0.20 to 0.15 as the distance from the interface between the layer 204 and the semiconductor crystal layer 203 increases.

The thickness of the semiconductor crystal layer 204 (carrier-supply layer B) is regulated to about 400 Å so that when the gate is ON, the tunnel effect of carriers (electrons) is effectively ensured between the below-described ohmic electrode 205 or 207 and a two-dimensional electron gas layer formed in the vicinity of the interface between the semiconductor crystal layers A and B.

Reference numerals 205, 206, and 207 denote a source electrode (ohmic electrode), a gate electrode (Schottky electrode), and a drain electrode (ohmic electrode), respectively. Each of the ohmic electrodes (the source electrode 205 and the drain electrode 207) is formed by providing a thin titanium (Ti) layer (thickness: about 100 Å) on the layer 204 through vapor deposition, and providing an aluminum (Al) layer (thickness: about 3,000 Å) on the Ti layer through vapor deposition. These ohmic electrodes are well deposited and alloyed through thermal treatment at about 700° C. to about 900° C. (flash annealing) for less than one second. Meanwhile, the gate electrode 206 (Schottky electrode) is formed by providing a nickel (Ni) layer (thickness: about 100 Å) on the layer 204 through vapor deposition, and providing a gold (Au) layer (thickness: about 3,000 Å) on the Ni layer through vapor deposition.

Next will be described the method for producing the aforementioned field-effect transistor 200 by focusing on the semiconductor crystal layer 204 (carrier-supply layer B).

Each of the semiconductor crystal layers 203 and 204 of the aforementioned field-effect transistor 200 is formed through crystal growth by metal-organic vapor phase epitaxy (MOVPE). This crystal growth process employs, for example, carrier gas ($H_2$ or $N_2$), ammonia ($NH_3$) gas, trimethylgallium ($Ga(CH_3)_3$) gas, and trimethylaluminum ($Al(CH_3)_3$) gas.

More specifically, the semiconductor crystal layers were formed through crystal growth under the following conditions.

1. Channel Layer A (Semiconductor Crystal Layer 203)
   (1) Crystal growth temperature $T_A$: 1,140 [° C.]
   (2) Layered structure: single layer (thickness: about 2 µm, formed of intrinsic GaN crystal)

2. Carrier-Supply Layer B (Semiconductor Crystal Layer 204)
   (1) Crystal growth temperature $T_B$: 1,000 [° C.]
   (2) Layered structure: multiple layers (six layers)
   First layer: thickness: about 70 Å, aluminum compositional proportion x=0.20
   Second layer: thickness: about 70 Å, aluminum compositional proportion x=0.19
   Third layer: thickness: about 60 Å, aluminum compositional proportion x=0.18
   Fourth layer: thickness: about 60 Å, aluminum compositional proportion x=0.17
   Fifth layer: thickness: about 70 Å, aluminum compositional proportion x=0.16
   Sixth layer: thickness: about 70 Å, aluminum compositional proportion x=0.15

Figure 9:
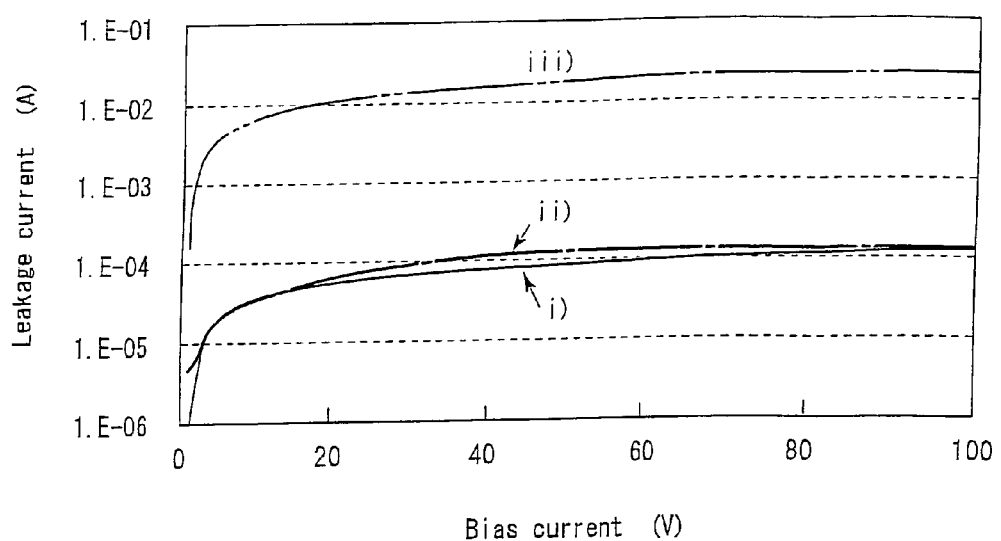
FIG. 9 is a graph showing leakage current characteristics of the field-effect transistor 200.

FIG. 9 is a graph showing gate leakage current characteristics of the field-effect transistor 200. In the graph of FIG. 9, curve i) correspond to gate leakage current characteristics of the field-effect transistor 200; curve ii) correspond to gate leakage current characteristics of a sample S2 in which the carrier-supply layer B is formed of a single $Al_{0.15}Ga_{0.85}N$ semiconductor crystal layer (thickness: about 400 Å); and curve iii) correspond to gate leakage current characteristics of a sample S3 in which the carrier-supply layer B is formed of a single $Al_{0.20}Ga_{0.80}N$ semiconductor crystal layer (thickness: about 400 Å). Needless to say, components (other than the carrier-supply layer B) of each of the samples S2 and S3 are similar to those of the field-effect transistor 200.

These leakage current measurement data show that the leakage current of the field-effect transistor 200 is equal to or lower than that of the sample S2, in which the carrier-supply layer B is formed of a single $Al_{0.15}Ga_{0.85}N$ semiconductor crystal layer (thickness: about 400 Å). The data also show that the leakage current of the field-effect transistor 200 is 1/100 or less that of the sample S3, in which the carrier-supply layer B is formed of a single $Al_{0.20}Ga_{0.80}N$ semiconductor crystal layer (thickness: about 400 Å); i.e., the leakage current of the field-effect transistor 200 is very effectively reduced as compared with the case of the sample S3.

In each of the field-effect transistor 200, sample S2, and sample S3, sheet resistance was measured at the interface between the channel layer A and the carrier-supply layer B. The measurement results are as follows.
(Sheet Resistance)
Field-effect transistor 200: about 600 [Ω/square]
Sample S2: about 700 [Ω/square]
Sample S3: about 500 [Ω/square]

The aforementioned test data show that the field-effect transistor 200 exhibits both high breakdown voltage due to effectively reduced leakage current, and high electrical conductivity due to effectively reduced sheet resistance (on-resistance) in a very well-balanced and reasonable manner, unlike the case of a conventional field-effect transistor. In other words, conventionally, it has not necessarily been easy to achieve a sheet resistance of about 600 [Ω/square] in a field-effect transistor exhibiting reduced leakage current as shown in curve i) of FIG. 9.

The multi-layer structure of the aforementioned carrier-supply layer B can be formed by slightly varying the supply amount of aluminum-supplying gas (i.e., trimethylaluminum (Al(CH$_3$)$_3$) gas) during crystal growth for forming the six layers (first to sixth layers) constituting the structure. Therefore, when the field-effect transistor 200 is produced through, for example, the above-described procedure, productivity is readily maintained at a level equal to or higher than that in the case of a conventional field-effect transistor.

The aforementioned effect of reducing leakage current is also based on that the crystal growth substrate 201 is formed of an impurity (Fe)-doped semi-insulating GaN crystal in bulk form of excellent crystallinity having a thickness of about 400 μm, the GaN crystal being produced through the production method described above in Embodiment 1. That is, employment of a crystal growth substrate of very high crystal quality is a very effective and important factor for forming a high-quality carrier-supply layer B (semiconductor crystal layer 204) of low dislocation density. Therefore, employment of the electronic-device-forming semiconductor substrate of the present invention is particularly effective.

Embodiment 5

FIG. 10-A is a schematic perspective view showing an amplifier circuit 300 of Embodiment 5, and FIG. 10-B shows the diagram of the amplifier circuit 300. The amplifier circuit 300 includes two aligned field-effect transistors 100, each being formed by providing successively group III nitride based compound semiconductor layers on a crystal growth substrate 101 in a manner similar to that described in Embodiment 3. As shown in FIG. 10-A, a resistor R and a capacitor $C_{in}$ are also formed on the crystal growth substrate 101, and, as shown in FIG. 10-B, these devices are electrically connected to one another to form a single amplifier.

With this configuration, the quality of each of the devices is improved, since the crystal quality of the crystal growth substrate 101 is very high as described in the previous embodiments. Therefore, the thus-produced amplifier (semiconductor integrated circuit) exhibits excellent operational characteristics on the basis of the operation and effects of the present invention.

[Other Modifications]

The present invention is not limited to the above-described embodiments, and the below-exemplified modifications may be made. Effects of the present invention can also be obtained through such modifications or applications according to the operation of the present invention.

(Modification 1)

In the aforementioned Embodiment 3 (FIG. 6), the channel layer A (103) is formed, through crystal growth, on the electronic-device-forming semiconductor substrate (101) of the present invention. However, the electronic-device-forming semiconductor substrate (i.e., crystal growth substrate) (101) may also serve as the channel layer A, since the substrate exhibits particularly excellent crystal quality. In such a case, after the crystal growth surface of the electronic-device-forming semiconductor substrate (101) is thoroughly cleaned, the carrier-supply layer B (104) is provided directly on the semiconductor substrate (101) for electronic devices.

With such a modification, the production process for a target electronic device can be very simplified, which is advantageous in terms of productivity.

(Modification 2)

The FET described in the aforementioned Embodiment 3 or 4 is of a type in which current flows, in a horizontal direction, between the electrodes provided above the semi-insulating electronic-device-forming semiconductor substrate of the present invention. The present invention can also be applied to, for example, an FET in which an electrode is provided at least a portion of the back surface of an electrically conductive crystal growth substrate (electrically conductive electronic-device-forming semiconductor substrate) so that current flows, in a vertical direction, through the crystal growth substrate or a semiconductor crystal layer provided on the substrate. Examples of such a vertical-conduction-type electronic device include field-effect transistors described in, for example, Japanese Patent Application Laid-Open (kokai) Nos. 2004-260140, 2000-349284, and H10-294461.

When the electrically conductive electronic-device-forming semiconductor substrate of the present invention is applied to a substrate for such a conventional electronic device, similar to the cases of the aforementioned embodiments, characteristics of the electronic device can be effectively improved due to, for example, the effect of reducing leakage current or sheet resistance. That is, effects obtained in the aforementioned embodiments can be obtained in such an electronic device. Particularly in the case of, for example, a field-effect transistor having the aforementioned conventional configuration, since an electrode is formed on the crystal growth substrate (electronic-device-forming semiconductor substrate), and current is caused to flow through the substrate, improvement in crystal quality of the electrically conductive substrate, which is due to employment of the electronic-device-forming semiconductor substrate of the present invention, achieves further enhanced effects.

When the electrically conductive electronic-device-forming semiconductor substrate of the present invention, which exhibits an electrical conductivity higher than that of a conventional substrate, is applied to, for example, a conventionally known power FET, an on-resistance of 1 mΩcm$^2$ or less is quite possibly or readily achieved. The electronic-device-forming semiconductor substrate of the present invention, which exhibits a thermal conductivity higher than that of a conventional substrate, is effective for reducing on-resistance, and for attaining heat radiation effect.

When a target electronic device is formed, addition of an impurity to a semiconductor crystal layer provided on a crystal growth substrate (electronic-device-forming semiconductor substrate) is not necessarily carried out through crystal growth treatment. For example, addition of an impurity to such a semiconductor crystal layer may be performed through ion implantation, thermal diffusion, or a similar technique.

Embodiment 6

In Embodiment 6, in order to determine crystal growth conditions for a detail (p-type layer 407) of the below-described LED, firstly, a p-type AlGaN crystal layer sample was formed, and semiconductor properties of the sample were evaluated.

This sample (p-type AlGaN crystal layer) was formed through crystal growth by metal-organic vapor phase epitaxy employing, as a carrier gas, a gas mixture of hydrogen (H$_2$) and nitrogen (N$_2$), in which the relative partial pressure of N$_2$ was varied from 0 to 1. A sapphire substrate was employed as a crystal growth substrate. This crystal growth process employed, as raw material gases, ammonia (NH$_3$) gas, trimethylgallium (Ga(CH$_3$)$_3$) gas, trimethylaluminum (Al(CH$_3$)$_3$) gas, trimethylindium (In(CH$_3$)$_3$) gas, silane (SiH$_4$)

gas, and cyclopentadienylmagnesium (Mg(C$_5$H$_5$)$_2$) gas. Nitrogen (N$_2$) was employed in a bubbler for supplying the metal source gases.

The aforementioned sample (p-type AlGaN crystal layer) was obtained by providing, on a sapphire substrate, an AlN buffer layer and an undoped GaN layer, and providing an Al$_{0.24}$Ga$_{0.76}$N:Mg layer on the GaN layer, followed by resistance-reducing treatment under the same conditions. The target p-type AlGaN crystal layer was doped with magnesium (i.e., an acceptor impurity).

Semiconductor properties of the thus-obtained sample are shown in Table 1.

TABLE 1

| Relative partial pressure R | 0 | 0.2 | 0.4 | 0.5 | 0.55 | 0.6 | 0.65 | 0.7 | 0.75 | 0.8 | 1.0 |
|---|---|---|---|---|---|---|---|---|---|---|---|
| PL intensity | x | o | o | o | o | o | o | o | Δ | Δ | Δ |
| Mobility | x | o | o | o | o | Δ | Δ | Δ | Δ | Δ | Δ |
| Surface roughness | o | o | o | o | o | o | o | o | o | o | Δ |
| Al proportion variation | x | x | x | x | x | Δ | Δ | o | o | o | Δ |
| Thickness variation | x | x | Δ | o | o | o | o | o | o | o | Δ |

As compared with the case where R = 1.0, o: improved, Δ: comparable, and x: impaired.

As used herein, the symbol "R" refers to the relative partial pressure of nitrogen in the aforementioned carrier gas. In Table 1, the symbol "O" corresponds to improvement of property as compared with the case where R=1.0; the symbol "Δ" corresponds to property comparable to that in the case where R=1.0; and the symbol "x" corresponds to impairment of property as compared with the case where R=1.0. Items for evaluation of the sample are as follows.

(1) PL Intensity

Samples were compared in terms of photoluminescence intensity as measured at a wavelength of 326 nm. Higher photoluminescence intensity is preferred.

(2) Mobility

Samples were compared in terms of hole mobility. Higher hole mobility is preferred.

(3) Surface Roughness

Samples were compared in terms of surface roughness. Smaller surface roughness—which is represented by a root mean square (r.m.s.) obtained from variations in height determined at a plurality of sites on the surface of the sample (p-type AlGaN crystal layer) with respect to a height-mean surface of the sample serving as a reference surface—is preferred.

(4) Al Proportion Variation

Samples were compared in terms of variation in Al compositional proportion as measured at a plurality of sites of the sample. More uniform Al compositional proportion is preferred.

(5) Thickness Variation

Samples were comparison in terms of variation in thickness as measured at a plurality of sites of the samples (p-type AlGaN crystal layer). More uniform thickness is preferred.

These evaluation data indicate that when a carrier gas containing nitrogen and hydrogen is employed, and the relative nitrogen partial pressure R is regulated to satisfy the relationship: $0.6 \leq R \leq 0.7$, best properties are obtained.

Next will be described an example of production of an LED including a p-type AlGaN crystal layer formed under such conditions.

Figure 12:
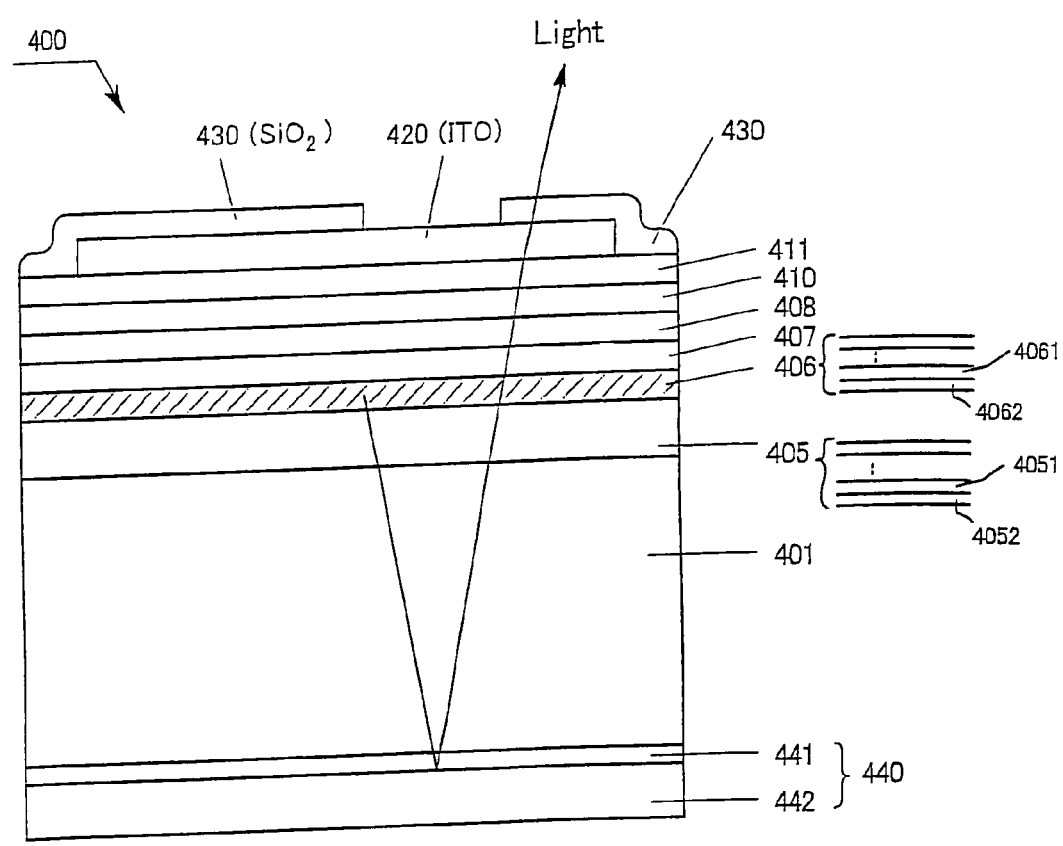
FIG. 12 is a cross-sectional view showing an LED 400 of Embodiment 6.

FIG. 12 is a schematic cross-sectional view showing the LED. The LED 400 includes an optical device substrate (crystal growth substrate 401) formed of a transparent GaN single crystal in bulk form (thickness: about 300 μm) of excellent crystallinity doped with silicon (Si) at 5×10$^{18}$ cm$^{-3}$, the crystal being produced through the production method described above in Embodiment 2.

On the optical device substrate (crystal growth substrate 401) is formed a multiple layer 405 (thickness: 90 nm) including 20 layer units, each including an undoped In$_{0.1}$Ga$_{0.9}$N layer 4051 (thickness: 1.5 nm) and an undoped GaN layer 4052 (thickness: 3 nm), wherein the layers 4051 and the layers 4052 are alternatingly provided. On the multiple layer 405 is formed a multiple quantum well layer 406 including undoped GaN barrier layers 4062 (thickness: 17 nm each) and undoped In$_{0.2}$Ga$_{0.8}$N well layers 4061 (thickness: 3 nm each), wherein the layers 4062 and the layers 4061 are alternatingly provided.

On the multiple quantum well layer 406 is provided a p-type layer 407 (thickness: 15 nm) formed of p-type Al$_{0.2}$Ga$_{0.8}$N doped with Mg at 2×10$^{19}$/cm$^3$. On the p-type layer 407 is formed an undoped Al$_{0.02}$Ga$_{0.98}$N layer 408 (thickness: 300 nm). On the layer 408 is provided a p-type GaN layer 410 (thickness: 80 nm) formed of a GaN crystal doped with magnesium at 1×10$^{20}$ cm$^{-3}$. On the layer 410 is provided a p-type GaN layer 411 (thickness: 20 nm) formed of a GaN crystal doped with magnesium at 2×10$^{20}$ cm$^{-3}$.

A p-electrode is formed of an ITO electrode 420 (thickness: about 300 nm) provided on the p-type GaN layer 411. The uppermost portion of the LED is formed of an SiO$_2$ protective film 430.

An n-electrode 440 is formed on the bottom surface of the crystal growth substrate 401 through vapor deposition. The n-electrode 440 has a multi-layer structure including a first layer 441 (thickness: about 18 nm) formed of vanadium (V), and a second layer 442 (thickness: about 500 nm) formed of aluminum (Al).

The n-electrode 440 may have a single-layer structure formed of rhodium (Rh) or a similar metal.

In the LED 400 having the aforementioned configuration, the p-type Al$_{0.2}$Ga$_{0.8}$N layer 407 was formed by using, as a carrier gas for raw material gases, a gas mixture of nitrogen and hydrogen (relative nitrogen partial pressure R=⅔), and crystal growth for forming the other semiconductor crystal layers was performed by using, as a carrier gas for raw material gases, merely nitrogen (i.e., R=1.0). The LED 400 exhibited an emission intensity higher, by about 20%, than that of an LED product having the same configuration as described above but including a p-type layer 407 formed by using, as a carrier gas, merely nitrogen (i.e., R=1.0).

When such a group III nitride based compound semiconductor layer containing an acceptor impurity and aluminum, which is formed through optimization of relative nitrogen partial pressure R, is provided directly on a light-emitting layer of an LED or an LD, the semiconductor layer effectively acts as a large-band-gap layer on the light-emitting layer, etc. Another conceivable reason why the aluminum-containing group III nitride based compound semiconductor layer is formed in very high quality is that the substrate 401 employs a crystal growth substrate formed of a semiconductor crystal of excellent quality produced through the production method described above in Embodiment 2. Therefore, conceivably, about 20% enhancement of emission intensity of the LED 400 is due to the synergistic effect of high quality of the crystal growth substrate and optimization of crystal growth conditions (relative nitrogen partial pressure R).

The aforementioned LED 400 was subjected to electrostatic breakdown voltage test at −1,000 v, and was found to exhibit an electrostatic breakdown voltage higher than that of a conventional LED. Conceivably, this high electrostatic breakdown voltage is achieved by the synergistic effect of very low dislocation density of the crystal growth substrate 401 and provision of the undoped $Al_{0.02}Ga_{0.98}N$ layer 408 having a thickness of 300 nm.

The aforementioned configuration of the LED 400 also has the following advantages.

(1) Since the LED employs an electrically conductive substrate, a crystal growth step is not required before a step of forming a conventional $n^+$-layer such as an AlN buffer layer, an undoped GaN layer, or an $n^+$-layer.

(2) Since the LED has electrodes on its top and bottom surfaces (hereinafter such a structure may be referred to as a "top-bottom electrode structure"), short circuit is less likely to occur between the electrodes.

(3) By virtue of the top-bottom electrode structure, a dry etching step is not required for forming the n-electrode on an $n^+$-layer.

(4) By virtue of the top-bottom electrode structure, the n-electrode on the bottom surface can also serve as a reflective metal film.

(5) By virtue of the top-bottom electrode structure, light can be extracted from almost the entirety of the top surface.

(6) By virtue of the top-bottom electrode structure, current density is uniformly distributed, and thus uneven light emission is less likely to occur.

Embodiment 7

Figure 13:
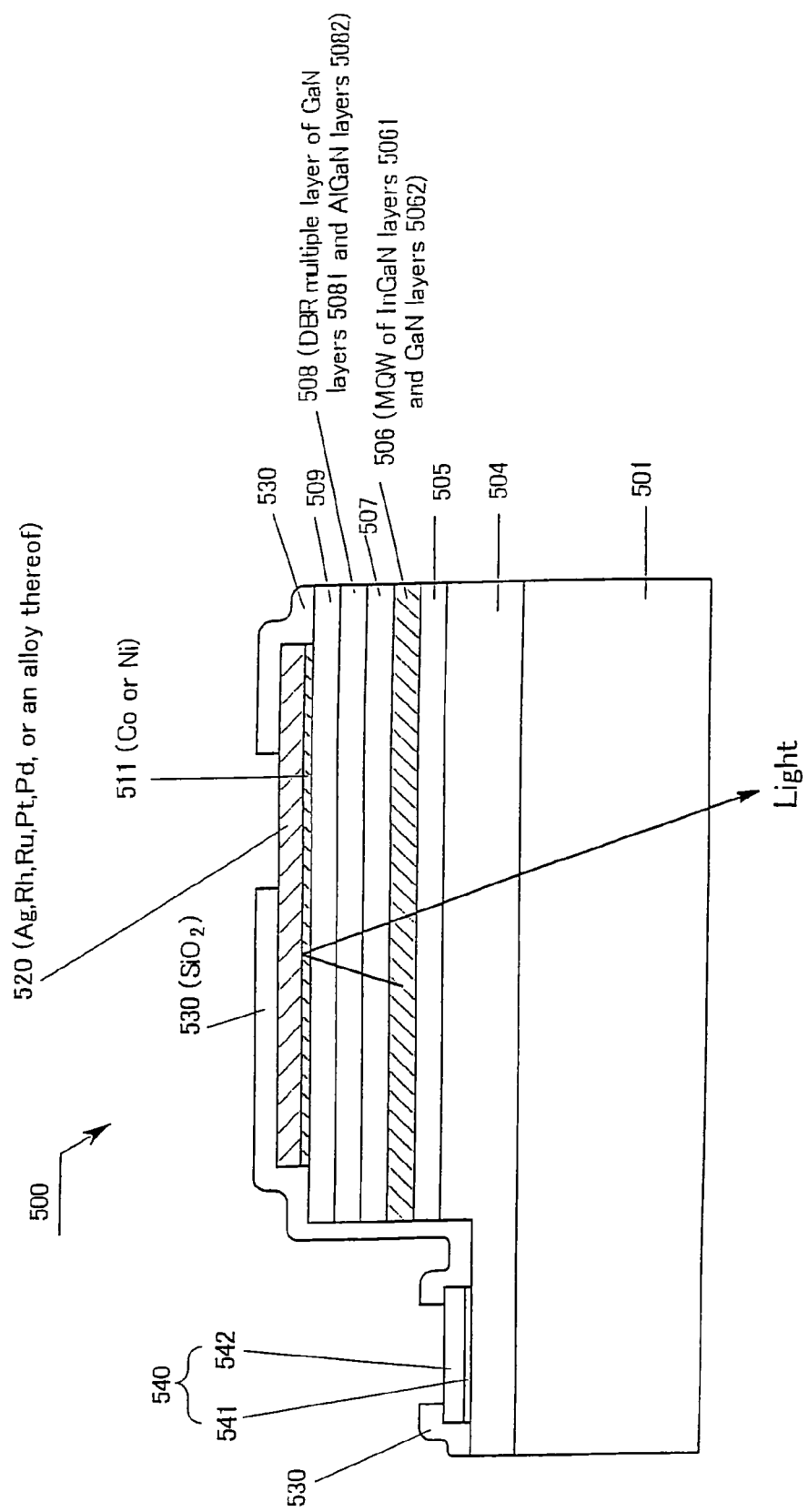
FIG. 13 is a cross-sectional view showing an LED 500 of Embodiment 7.

FIG. 13 is a schematic cross-sectional view showing an LED 500 of Embodiment 7. The LED 500 includes a transparent, optical device substrate 501 in bulk form of excellent crystallinity (thickness: about 400 μm). On the optical device substrate 501 is provided an n-type contact layer 504 (high-carrier-concentration $n^+$-layer) (thickness: about 5 μm) formed of GaN doped with silicon (Si) at $1 \times 10^{18}/cm^3$.

The optical device substrate 501 is formed of a GaN crystal (thickness: about 400 μm) doped with silicon (Si) at $5 \times 10^{18}$ $cm^{-3}$, the crystal being produced through the production method described above in Embodiment 2.

On the n-type contact layer 504 is provided an n-type layer 505 (thickness: 25 nm) formed of n-type $Al_{0.15}Ga_{0.85}N$ doped with silicon (Si) at $1 \times 10^{17}/cm^3$. On the n-type layer 505 is formed a light-emitting layer 506 having a multiple quantum well structure including three layer units, each including an undoped $In_{0.2}Ga_{0.8}N$ well layer 5061 (thickness: 3 nm) and an undoped GaN barrier layer 5062 (thickness: 20 nm).

On the light-emitting layer 506 is provided a p-type layer 507 (thickness: 25 nm) formed of p-type $Al_{0.15}Ga_{0.85}N$ doped with Mg at $2 \times 10^{19}/cm^3$. On the p-type layer 507 is formed a DBR multiple layer 508 including five layer units, each including an undoped GaN layer 5081 (thickness: 47 nm) and an undoped $Al_{0.25}Ga_{0.75}N$ layer 5082 (thickness: 49 nm). On the DBR multiple layer 508 was provided a p-type contact layer 509 (thickness: 100 nm) formed of p-type GaN doped with Mg at $8 \times 10^{19}/cm^3$.

A thin-film metal layer 511 is formed on the p-type contact layer 509 through metal vapor deposition. The thin-film metal layer 511, which is bonded to the p-type contact layer 509, is formed of a cobalt (Co) or nickel (Ni) layer (thickness: about 10 Å). A positive electrode 520 (thickness: about 3,000 Å) was formed from rhodium (Rh). The positive electrode 520 may be formed of a metal layer constituted by silver (Ag), ruthenium (Ru), platinum (Pt), palladium (Pd), or an alloy containing at least one of these metals.

An n-electrode 540 having a multi-layer structure is formed by providing, on an exposed portion of the n-type contact layer 504, a first layer 541 (thickness: about 18 nm) formed of vanadium (V) and a second layer 542 (thickness: about 100 nm) formed of aluminum (Al). The uppermost portion of the LED is formed of an $SiO_2$ protective film 530.

Through provision of the DBR multiple layer 508, the LED 500 exhibited an emission output about 1.4 times that of an LED sample having almost the same configuration as described above but not including such a DBR multiple layer 508.

Through provision of the DBR multiple layer 508, which has a multi-layer structure including undoped semiconductor crystal layers, the LED exhibited a very high breakdown voltage (i.e., resistance to a forward voltage of 6,000 V). Another conceivable reason why such a high breakdown voltage is achieved is that the crystal growth substrate (optical device substrate 501) has low dislocation density. Therefore, conceivably, the aforementioned high breakdown voltage is due to the synergistic effect of high quality of the crystal growth substrate and provision of the multi-layer structure including undoped semiconductor crystal layers (DBR multiple layer 508).

Embodiment 8

Figure 14:
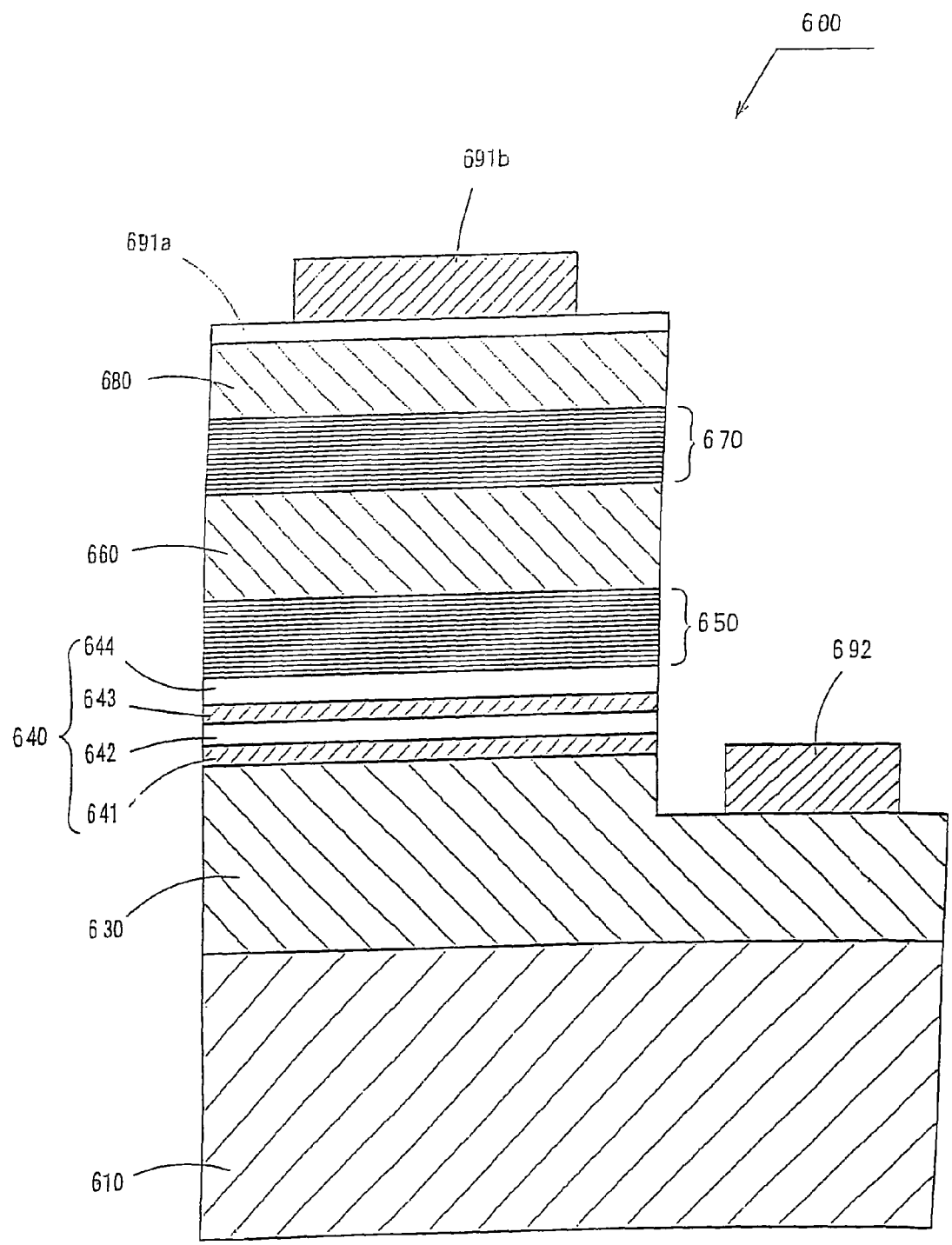
FIG. 14 is a cross-sectional view showing an LED 600 of Embodiment 8.

FIG. 14 is a cross-sectional view showing an LED 600 of Embodiment 8. The LED 600 is formed by successively providing, through crystal growth, an n-type contact layer 630, an electrostatic voltage-resistant section 640, an n-type cladding layer 650, an MQW active layer 660, a p-type cladding layer 670, and a p-type contact layer 680 on the crystal growth surface of an optical device substrate 610 having the same configuration as the aforementioned optical device substrate 501 of the LED 500. The electrostatic voltage-resistant section 640 is formed by sequentially stacking, through crystal growth, an undoped semiconductor layer 641, a doped semiconductor layer 642, an undoped semiconductor layer 643, and a doped semiconductor layer 644 on the layer 630. In the electrostatic voltage-resistant section 640, the undoped semiconductor layer 641 and the doped semiconductor layer 642 constitute a first voltage-resistant structure according to the present invention, and the undoped semiconductor layer 643 and the doped semiconductor layer 644 constitute a second voltage-resistant structure according to the present invention.

The production method for the LED 600 will next be described with reference to FIG. 14.

Each of the aforementioned semiconductor layers constituting the LED 600 is formed through crystal growth by metal-organic vapor phase epitaxy (MOVPE). This crystal growth process employs, for example, carrier gas ($H_2$ or $N_2$), ammonia ($NH_3$) gas, trimethylgallium ($Ga(CH_3)_3$, hereinafter may be referred to as "TMG") gas, trimethylindium ($In(CH_3)_3$, hereinafter may be referred to as "TMI") gas, trimethylaluminum ($Al(CH_3)_3$, hereinafter may be referred to as "TMA") gas, silane (SiH$_4$) gas, and cyclopentadienylmagnesium (Mg(C$_5$H$_5$)$_2$, hereinafter may be referred to as "CP$_2$Mg") gas.

Crystal growth for forming these semiconductor layers may be carried out through, for example, molecular beam epitaxy (MBE) or halide vapor phase epitaxy (HVPE) in place of the aforementioned metal-organic vapor phase epitaxy (MOVPE).

(Cleaning of Crystal Growth Surface)

Firstly, the temperature of the optical device substrate 610 is raised to 1,050° C. under a stream of hydrogen gas, to thereby clean the crystal growth surface of the substrate for about five minutes.

(n-Type Contact Layer 630)

Subsequently, the temperature of the optical device substrate 610 is raised to 1,100° C. under a stream of hydrogen gas (carrier gas) and ammonia gas. Immediately after the substrate temperature reaches 1,100° C., the n-type GaN contact layer 630 having an Si content of 4.5×10$^{18}$ [cm$^{-3}$] is grown so as to have a thickness of 4 μm by use of TMG gas and ammonia gas as raw material gases, and silane gas as an impurity gas.

(Electrostatic Voltage-Resistant Section 640)

(1) Undoped Semiconductor Layer 641

Subsequently, supply of silane gas is stopped, and the undoped semiconductor layer 641 formed of undoped GaN is grown at 1,100° C. so as to have a thickness of 200 nm by use of TMG gas and ammonia gas.

(2) Doped Semiconductor Layer 642

Subsequently, supply of TMG gas is stopped, and the temperature is lowered to 850° C. When the temperature reaches 850° C., TMG gas and silane gas are supplied, and the doped semiconductor layer 642 formed of GaN doped with Si at 4.5×10$^{18}$ [cm$^{-3}$] is grown so as to have a thickness of 50 nm.

These two semiconductor layers; i.e., the undoped semiconductor layer 641 and the doped semiconductor layer 642, constitute the first voltage-resistant structure (as counted from the n-type contact layer 630) according to the present invention.

(3) Undoped Semiconductor Layer 643

Thereafter, supply of silane gas is stopped, and the undoped semiconductor layer 643 formed of undoped GaN is grown at the same temperature (850° C.) so as to have a thickness of 200 nm.

(4) Doped Semiconductor Layer 644

Finally, silane gas is supplied, and the doped semiconductor layer 644 formed of GaN doped with Si (4.5×10$^{18}$ [cm$^{-3}$]) is grown at the same temperature (850° C.) so as to have a thickness of 30 nm.

These two semiconductor layers; i.e., the undoped semiconductor layer 643 and the doped semiconductor layer 644, constitute the second voltage-resistant structure (as counted from the n-type contact layer 630) according to the present invention.

(n-Type Cladding Layer 650)

Subsequently, supply of silane gas and TMG gas is stopped, and the temperature is raised to 1,050° C. When the temperature reaches 1,050° C., TMG gas is supplied, and a first nitride semiconductor layer formed of undoped GaN is grown so as to have a thickness of 4 nm. Subsequently, the temperature is regulated to 800° C., and a second nitride semiconductor layer formed of undoped In$_{0.13}$Ga$_{0.87}$N is grown so as to have a thickness of 2 nm by use of TMG, TMI, and ammonia gases. These layer growth processes are repeated, thereby alternatingly providing 10 first nitride semiconductor layers and 10 second nitride semiconductor layers. Finally, a first nitride semiconductor layer (GaN layer) is grown so as to have a thickness of 4 nm, to thereby form the n-type cladding layer 650 (thickness: 64 nm) having a multi-layer superlattice structure.

(MQW Active Layer 660)

Subsequently, the temperature is regulated to 800° C., and an undoped GaN barrier layer (thickness: 20 nm) and an undoped In$_{0.2}$Ga$_{0.8}$N well layer (thickness: 3 nm) are alternatingly provided, to thereby form the MQW active layer 660.

(p-Type Cladding Layer 670)

Subsequently, a third nitride semiconductor layer formed of p-type Al$_{0.2}$Ga$_{0.8}$N doped with Mg (1×10$^{20}$ [cm$^{-3}$]) is grown at 1,050° C. so as to have a thickness of 4 nm by use of TMG, TMA, ammonia, and CP$_2$Mg (cyclopentadienylmagnesium) gases. Subsequently, the temperature is regulated to 800° C., and a fourth nitride semiconductor layer formed of In$_{0.03}$Ga$_{0.97}$N doped with Mg (1×10$^{20}$ [cm$^{-3}$]) is grown so as to have a thickness of 2.5 nm by use of TMG, TMI, ammonia, and CP$_2$Mg gases. These layer growth processes are repeated, thereby alternatingly stacking five third nitride semiconductor layers and five fourth nitride semiconductor layers. Finally, a third nitride semiconductor layer is grown so as to have a thickness of 4 nm, to thereby form the p-type cladding layer 670 (thickness: 36.5 nm) having a multi-layer superlattice structure.

(p-Type Contact Layer 680)

Subsequently, the p-type contact layer 680 formed of p-type GaN doped with Mg (1×10$^{20}$ [cm$^{-3}$]) is grown at 1,050° C. so as to have a thickness of 70 nm by use of TMG, ammonia, and CP$_2$Mg gases.

Thereafter, a mask having a predetermined pattern is formed on the surface of the uppermost layer (i.e., the p-type contact layer 680), and then etching is performed from the side of the p-type contact layer 680 by means of an RIE (reactive ion etching) apparatus, to thereby expose a portion of the n-type contact layer 630 as shown in FIG. 14.

Subsequently, a transparent p-electrode 691*a* is formed on the p-type contact layer 680 through vapor deposition, and an n-electrode 692 is formed on the n-type contact layer 630 through vapor deposition. The p-electrode 691*a* is formed by providing a first layer (thickness: about 1.5 nm) formed of cobalt (Co) directly on the p-type contact layer 680, and providing a second layer (thickness: about 6 nm) formed of gold (Au) on the cobalt layer.

Subsequently, a p-pad electrode 691*b* is formed on the transparent p-electrode 691*a* through vapor deposition. The p-pad electrode 691*b* is formed by successively providing a first layer (thickness: about 18 nm) formed of vanadium (V), a second layer (thickness: about 1.5 μm) formed of gold (Au), and a third layer (thickness: about 10 nm) formed of aluminum (Al).

The n-electrode 692 having a multi-layer structure is formed by successively providing, on the exposed portion of the n-type contact layer 630, a first layer (thickness: about 18 nm) formed of vanadium (V) and a second layer (thickness: about 100 nm) formed of aluminum (Al).

An SiO$_2$ protective film may be formed, for example, on the exposed surface of the transparent p-electrode 691*a*, or the side surfaces of the semiconductor layers exposed through, for example, etching. The bottom surface of the sapphire substrate 610 (i.e., the lowermost surface) may be coated with, for example, a reflective metal layer (thickness: about 500 nm) formed through vapor deposition of aluminum (Al). The material for forming such a reflective metal layer may be a metal (e.g., Rh, Ti, or W), or may be a nitride (e.g., TiN or HfN).

The thus-produced LEDs 600 were found to have an emission peak wavelength of about 470 nm (blue light emission), and a driving voltage Vf of about 3.5 v at a forward current of 20 mA. The LEDs 600 were subjected to endurance test (ESD test with a human body model (HBM)) under application of a reverse electrostatic voltage of 1,000 v to 1,800 v. At any of different electrostatic voltages within this range, all the non-damaged LEDs 600 accounted for more than 80%, which is considerably high as compared with conventional cases.

Such a considerably improved breakdown voltage is very greatly attributable to the electrostatic voltage-resistant section 640. Another conceivable reason why such a high breakdown voltage is achieved is that the crystal growth substrate (optical device substrate 610) has low dislocation density. Therefore, conceivably, the aforementioned high breakdown voltage is due to the synergistic effect of high quality of the crystal growth substrate and provision of the electrostatic voltage-resistant section 640.

[Other Modifications]

The present invention is not limited to the above-described embodiments, and the below-exemplified modifications may be made. Effects of the present invention can also be obtained through such modifications or applications according to the operation of the present invention.

(Modification 3)

In the aforementioned Embodiment 6, the multiple quantum well layer 406 is formed as a light-emitting layer. However, in an LED including a p-type AlGaN layer as described above in Embodiment 6, the light-emitting layer of the LED may have an arbitrary structure; for example, a single-layer structure, a single quantum well (SQW) structure, or a multiple quantum well (MQW) structure. Particularly when the light-emitting layer has a multiple quantum well structure, preferably, the light-emitting layer includes at least a well layer formed of an indium (In)-containing group III nitride based compound semiconductor $Al_yGa_{1-y-z}In_zN$ ($0 \leq y<1$, $0<z \leq 1$) having appropriate compositional proportions.

Such a configuration including the aforementioned p-type AlGaN layer may be applied to another optical device (e.g., an LD).

(Modification 4)

Needless to say, an electrostatic voltage-resistant structure similar to that employed in the aforementioned LED 600 of Embodiment 8 (e.g., the optical device substrate 610 or the electrostatic voltage-resistant section 640) is very useful for, for example, a conventional semiconductor laser. Specifically, when an electrostatic voltage-resistant structure similar to the aforementioned one is applied to such a semiconductor laser including a well-known current constriction structure, a light-guiding layer, etc., electrostatic breakdown voltage of the semiconductor laser can be considerably improved.

In the case where, for example, an end-surface light-emitting laser is produced, an important point is that end surfaces of a resonator are formed cleanly through cleavage, and therefore employment of a crystal growth substrate of high crystal quality (i.e., the optical device substrate of the present invention) is very advantageous. Since light emitted from a light-emitting layer of the semiconductor laser is reflected many times in the resonator before being output from the diode, employment of the optical device substrate of the present invention is very advantageous, from the viewpoint of enhancement of transparency of the resonator per se.

(Modification 5)

In addition, employment of the optical device substrate of the present invention, which exhibits excellent crystal quality in terms of dislocation density, transparency, etc., is very advantageous for improving the internal quantum efficiency, external quantum efficiency, electrostatic breakdown voltage, service life, yield, etc. of a conventionally known semiconductor photoreceptor having a so-called PIN structure as described in, for example, Japanese Patent Application Laid-Open (kokai) No. 2000-174323 entitled "GaN based semiconductor photoreceptor."

Since the optical device substrate of the present invention can be readily and optionally provided with electrical conductivity, when a top-bottom electrode structure similar to that employed in the aforementioned LED 400 of Embodiment 6 is applied to such a photoreceptor, the photoreceptor has the following advantages.

(1) Since the photoreceptor employs an electrically conductive substrate, a crystal growth step is not required before a step of forming a conventional $n^+$-layer such as an AlN buffer layer, an undoped GaN layer, or an $n^+$-layer.

(2) Since the photoreceptor has electrodes on its top and bottom surfaces (top-bottom electrode structure), short circuit is less likely to occur between the electrodes.

(3) By virtue of the top-bottom electrode structure, a dry etching step is not required for forming an n-electrode on an $n^+$-layer.

(4) By virtue of the top-bottom electrode structure, the n-electrode on the bottom surface can also serve as a reflective metal film.

(5) By virtue of the top-bottom electrode structure, light can be received by almost the entirety of the top surface.

(6) By virtue of the top-bottom electrode structure, current density is uniformly distributed, and thus uneven photoreception is less likely to occur.

INDUSTRIAL APPLICABILITY

The present invention is useful for producing a semiconductor device from a group III nitride based compound semiconductor crystal. Examples of such a semiconductor device include, in addition to the aforementioned electronic devices, light-emitting devices (e.g., an LED and an LD), phororeceptors, and optoelectronic integrated circuits (OEICs) including such devices.

The transistor of the present invention may be a field-effect transistor or a bipolar transistor. Examples of field-effect transistors which can be produced according to the present invention include semiconductor devices such as MISFET, MOSFET, HFET, MODFET, JFET, HJFET, and HEMT; and power transistors for power control, such as power MOSFET and IGBT.

The invention claimed is:

1. A method for producing a semiconductor substrate for an electronic device or an optical device, the method comprising reacting nitrogen (N) with gallium (Ga), aluminum (Al), or indium (In), which are a group III element, in a flux mixture containing a plurality of metal elements selected from among alkali metals and alkaline earth metals, to thereby grow a group III nitride based compound semiconductor crystal, characterized in that at least a portion of a base substrate on which the group III nitride based compound semiconductor crystal is grown is formed of a flux-soluble material, and the flux-soluble material is dissolved in the flux mixture, at a temperature near the growth temperature of the group III nitride based compound semiconductor crystal, during the course of growth of the semiconductor crystal or after completion of growth of the semiconductor crystal.

2. A semiconductor substrate production method according to claim 1, wherein at least a portion of the flux-soluble material contains an impurity to be added to the group III nitride based compound semiconductor crystal.

3. A semiconductor substrate production method according to claim 1, wherein the group III nitride based compound semiconductor crystal is grown while the flux mixture and the group III element are mixed under stirring.

4. A semiconductor substrate production method according to claim 1, wherein, before growth of the group III nitride based compound semiconductor crystal, the crystal growth surface of the base substrate or seed crystal is subjected to cleaning treatment at a temperature of 900° C. to 1,100° C. for one minute or more by using, as a cleaning gas, hydrogen ($H_2$) gas, nitrogen ($N_2$) gas, ammonia ($NH_3$) gas, a rare gas (He, Ne, Ar, Kr, Xe, or Rn), or a gas mixture obtained by mixing, in arbitrary proportions, two or more gases selected from among these gases.

5. A semiconductor substrate for an electronic device or an optical device, characterized by being produced through a semiconductor substrate production method as recited in claim 4, which substrate has a surface dislocation density of $1 \times 10^5$ cm$^{-2}$ or less, and a maximum size of 1 cm or more.

6. A semiconductor substrate according to claim 5, which has a thickness of 300 μm or more.

7. An electronic device comprising a crystal growth substrate, and a group III nitride based compound semiconductor crystal layer provided thereon, characterized in that the crystal growth substrate is formed of a semiconductor substrate as recited in claim 5.

8. A field-effect transistor comprising a group III nitride based compound semiconductor crystal layer formed through crystal growth, characterized in that the transistor comprises a semiconductor substrate as recited in claim 5; a channel layer A formed through direct or indirect crystal growth on the semiconductor substrate; and a carrier-supply layer B formed through direct crystal growth on the channel layer A, wherein the band gap of the carrier-supply layer B ($E_B$) is greater than the band gap of the channel layer A ($E_A$) at least in the vicinity of the interface between the channel layer A and the carrier-supply layer B.

9. A field-effect transistor according to claim 8, wherein at least one of the channel layer A and the carrier-supply layer B is formed of an undoped semiconductor crystal.

10. A field-effect transistor according to claim 8, wherein the channel layer A is formed of two-component or three-component $Al_xGa_{1-x}N$ ($0 \leq x < 1$), and the carrier-supply layer B is formed of three-component $Al_yGa_{1-y}N$ ($x < y \leq 1$).

11. A field-effect transistor according to claim 8, wherein the interface is formed to have a virtually flat plane by suppressing sublimation of atoms of the channel layer A which are present in the vicinity of the interface.

12. A field-effect transistor according to claim 8, wherein the carrier-supply layer B is formed of $Al_yGa_{1-y}N$ ($0.45 > y > 0.04$), and the aluminum compositional proportion y in the carrier-supply layer B is generally reduced monotonously as the distance from the interface increases.

13. A semiconductor light-emitting device comprising a crystal growth substrate, and a plurality of group III nitride based compound semiconductor crystal layers provided thereon, wherein the crystal growth substrate is formed of a semiconductor substrate as recited in claim 5.

14. A semiconductor light-emitting device according to claim 13, which comprises a light-emitting layer formed of a group III nitride based compound semiconductor, and a group III nitride based compound semiconductor crystal layer provided on the light-emitting layer, the semiconductor crystal layer containing aluminum and an acceptor impurity, and being formed through crystal growth treatment by use of a carrier gas containing a gas mixture of hydrogen ($H_2$) and nitrogen ($N_2$) in which the relative nitrogen partial pressure is 40% to 80%.

15. An optical device according to claim 13, which comprises at least one contact layer, an active layer, and a plurality of voltage-resistant structures provided therebetween, each of the structures including two layers which are an undoped semiconductor layer provided on the side of the contact layer, and an impurity-doped semiconductor layer provided on the undoped semiconductor layer.

16. An optical device according to claim 15, wherein the contact layer is an n-type contact layer, and the impurity is an n-type impurity.

17. A semiconductor light-emitting device according to claim 13, which comprises a DBR multiple layer which is formed by alternatingly providing, between two p-type semiconductor crystal layers, a plurality of undoped group III nitride based compound semiconductor crystal layers having different compositions in a repeated manner.

18. A semiconductor light-emitting device according to claim 17, wherein the DBR multiple layer includes a plurality of undoped GaN crystal layers, and a plurality of undoped $Al_xGa_{1-x}N$ crystal ($0 < x < 1$) layers.

19. A semiconductor photoreceptor comprising a crystal growth substrate, and a plurality of group III nitride based compound semiconductor crystal layers provided thereon, wherein the crystal growth substrate is formed of a semiconductor substrate as recited in claim 5.

20. A method for producing a semiconductor optical device, the method comprising providing, on a crystal growth substrate, a plurality of group III nitride based compound semiconductor crystal layers, characterized in that the crystal growth substrate is formed of a semiconductor substrate as recited in claim 5, and, before growth of the group III nitride based compound semiconductor crystal layers, the crystal growth surface of the semiconductor substrate is subjected to cleaning treatment at a temperature of 900° C. to 1,100° C. for one minute or more by using, as a cleaning gas, hydrogen ($H_2$) gas, nitrogen ($N_2$) gas, ammonia ($NH_3$) gas, a rare gas (He, Ne, Ar, Kr, Xe, or Rn), or a gas mixture obtained by mixing, in arbitrary proportions, two or more gases selected from among these gases.

* * * * *

UNITED STATES PATENT AND TRADEMARK OFFICE
CERTIFICATE OF CORRECTION

| | | |
|---|---|---|
| PATENT NO. | : 8,084,281 B2 | Page 1 of 1 |
| APPLICATION NO. | : 12/087048 | |
| DATED | : December 27, 2011 | |
| INVENTOR(S) | : Naoki Shibata et al. | |

It is certified that error appears in the above-identified patent and that said Letters Patent is hereby corrected as shown below:

In claim 17, at column 36, line 30, change "mariner" to -- manner --

Signed and Sealed this
Thirteenth Day of March, 2012

David J. Kappos
*Director of the United States Patent and Trademark Office*